(12) United States Patent
Miki

(10) Patent No.: US 10,741,362 B2
(45) Date of Patent: Aug. 11, 2020

(54) IMPEDANCE MATCHING METHOD AND IMPEDANCE MATCHING DEVICE

(71) Applicant: Tokyo Electron Limited, Tokyo (JP)

(72) Inventor: Hiroshi Miki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/548,063

(22) Filed: Aug. 22, 2019

(65) Prior Publication Data

US 2020/0075291 A1 Mar. 5, 2020

(30) Foreign Application Priority Data

Aug. 28, 2018 (JP) .................. 2018-159605

(51) Int. Cl.
*H01J 37/32* (2006.01)
*H03H 7/40* (2006.01)

(52) U.S. Cl.
CPC ......... *H01J 37/32183* (2013.01); *H03H 7/40* (2013.01)

(58) Field of Classification Search
None
See application file for complete search history.

(56) References Cited

U.S. PATENT DOCUMENTS

| 6,291,999 B1* | 9/2001 | Nishimori | H01J 37/32174 324/464 |
| 7,489,145 B2* | 2/2009 | Matoba | H01J 37/321 324/601 |
| 8,952,676 B2* | 2/2015 | Kim | H04B 13/005 323/218 |
| 2017/0103872 A1* | 4/2017 | Howald | H01J 37/32183 |
| 2020/0035461 A1* | 1/2020 | Bhutta | H01J 37/32183 |

FOREIGN PATENT DOCUMENTS

JP 10-209789 A 8/1998
WO 2017/002196 A 1/2017

* cited by examiner

*Primary Examiner* — Minh D A
*Assistant Examiner* — James H Cho
(74) *Attorney, Agent, or Firm* — Abelman, Frayne & Schwab

(57) ABSTRACT

An impedance matching method includes: calculating an output impedance of a theoretical circuit model set in advance from actual values of two variable components and a measured value of an input impedance; calculating values of the two variable components at the time of impedance matching through an arithmetic operation under a matching condition in the theoretical circuit model based on the calculated value of the output impedance assuming that the output impedance due to matching transition has the same value; and controlling the actual values of the variable components of the impedance matching device to correspond to the calculated two variable component values.

18 Claims, 20 Drawing Sheets

ANALYSIS DIAGRAM 1

ANALYSIS DIAGRAM 1

ANALYSIS DIAGRAM 2

IMPEDANCE MATCHING METHOD AND IMPEDANCE MATCHING DEVICE

CROSS-REFERENCE TO RELATED APPLICATIONS

This application is based on and claims priority from Japanese Patent Application No. 2018-159605 filed on Aug. 28, 2018 with the Japan Patent Office, the disclosure of which is incorporated herein in its entirety by reference.

TECHNICAL FIELD

The present disclosure relates to an impedance matching method and an impedance matching device.

BACKGROUND

Plasma processing apparatuses are often used in semiconductor manufacturing processes. A plasma processing apparatus supplies radio-frequency power to a plasma processing unit having a chamber in which a substrate to be processed is accommodated to generate plasma in the chamber, and performs a plasma processing such as, for example, an etching processing or a film forming processing by the plasma.

In such a plasma processing apparatus, an impedance matching device is provided between a radio-frequency power supply and a plasma processing unit in order to efficiently supply radio-frequency power from the radio-frequency power supply to the plasma processing unit during the processing. The impedance matching device automatically matches the impedance on the radio-frequency power supply side with the impedance on the load (e.g., an electrode, plasma, or chamber) side. Since the radio-frequency power supply and transmission cables are usually designed to have a pure resistance output of 50Ω, the matching circuit of the impedance matching device is adjusted such that the impedance on the load side in which the impedance matching device is also included is 50Ω.

The impedance matching device basically includes two variable elements (e.g., variable capacitors), and the load side impedance is capable of being adjusted by adjusting the position of the variable elements. Then, when the impedance of the plasma load changes due to, for example, pressure fluctuation during the plasma processing, the positions (reactance) of the variable elements are adjusted so as to automatically match the impedance on the load side to a matching point (50Ω).

As for the impedance matching device, for example, the impedance matching devices described in Japanese Patent Laid-Open Publication No. 10-209789 and International Publication Pamphlet No. WO 2017/002196 are generally used. In Japanese Patent Laid-Open Publication No. 10-209789 and International Publication Pamphlet No. WO 2017/002196, an impedance having two variable capacitors as a matching circuit is used. Then, the load side impedance is measured, and the positions of the two variable capacitors are alternately shifted such that the measured value approaches a target value (a matching point).

SUMMARY

An impedance matching method according to an aspect disclosed herein is an impedance matching method using an impedance matching device provided between a radio-frequency power supply and a load. The impedance matching method includes: calculating an output impedance in a theoretical circuit model set in advance and simulating a circuit configuration of a load side in which a matching circuit unit of an impedance matching device is included from actual values of two variable components used for impedance matching of the impedance matching device and a measured value of the input impedance viewed from an input portion of the impedance matching device; calculating values of the two variable components at a time of impedance matching through an arithmetic operation under a matching condition in the theoretical circuit model based on a calculated value of the output impedance, assuming that the output impedance due to matching transition has the same value; and controlling the actual values of the variable components of the impedance matching device to correspond to the calculated values of the two variable components.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

First Embodiment

Figure 1:
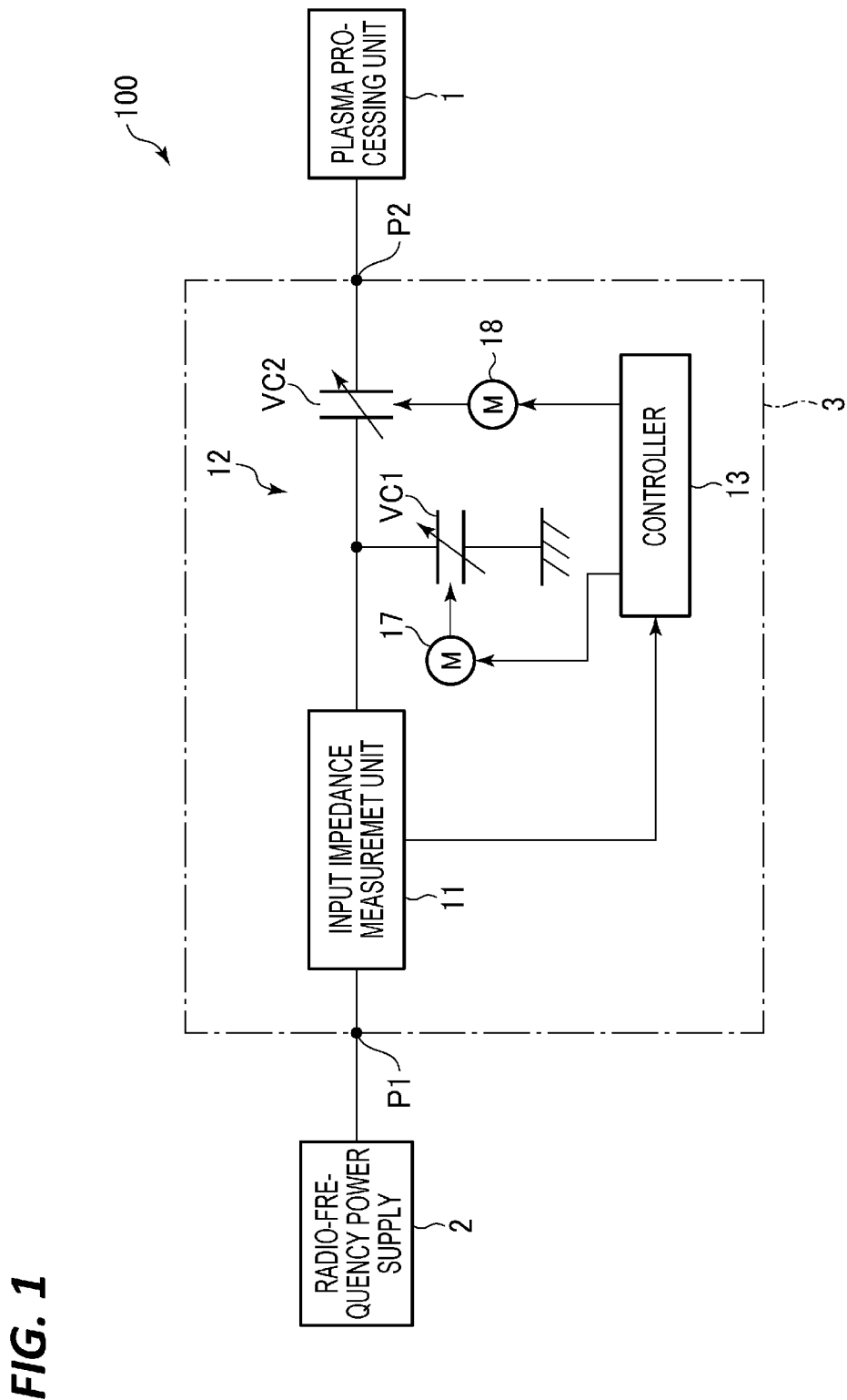
FIG. 1 is a block diagram illustrating a plasma processing apparatus including an impedance matching device according to a first embodiment.

FIG. 1 is a block diagram illustrating a plasma processing apparatus including an impedance matching device according to a first embodiment.

A plasma processing apparatus 100 of the present embodiment includes a plasma processing unit 1, a radio-frequency power supply 2 configured to supply radio-frequency power to the plasma processing unit 1, and an impedance matching device 3 provided between the radio-frequency power supply 2 and the plasma processing unit 1.

The plasma processing unit 1 has a chamber configured to accommodate a substrate to be processed and an electrode. By supplying radio-frequency power from the radio-frequency power supply 2 to the electrode, plasma is generated in the chamber.

The impedance matching device 3 is for automatically matching the radio-frequency power supply side impedance with the load (e.g., an electrode, plasma, or chamber) side impedance, and includes an input impedance measurement unit 11, a matching circuit unit 12, and a controller 13.

In the present embodiment, the impedance matching device 3 is configured in an inverted L type. That is, as variable elements which are two variable components used for impedance matching, the matching circuit unit 12 includes a first variable capacitor VC1 and a second variable capacitor VC2 each connected in parallel or in series with the load on the plasma processing unit 1 side with respect to the radio-frequency power supply 2. Positions defining the capacitances of the first variable capacitor VC1 and the second variable capacitor VC2 are adjusted by step motors 17 and 18, respectively. P1 is an input port and P2 is an output port.

Since the radio-frequency power supply 2 and the transmission cable are usually designed to have a pure resistance output of 50Ω, the controller 13 controls the step motors 17 and 18 such that the impedance on the load side in which the impedance matching device 3 is also included is 50Ω. That is, the step motors 17 and 18 function as variable units. The other circuit components of the matching circuit unit 12 are omitted here.

The input impedance measurement unit 11 is provided at the input portion of the impedance matching device 3, that is, at the front stage of the matching circuit unit 12, and measures the input impedance viewed from the input portion of the impedance matching device 3. The input impedance measurement unit 11 has, for example, a directional coupler. The directional coupler separates a traveling wave voltage and a reflected wave voltage from the radio-frequency voltage of the input port P1 and outputs the traveling wave voltage and the reflected wave voltage to the controller 13. Based on these, the controller 13 measures the input impedance, and calculates a reflection coefficient.

The controller 13 stores a theoretical circuit model that simulates a network on the load side in which the matching circuit unit 12 in an actual machine is included.

In the present embodiment, as will be described in detail below, the controller 13 substitutes the circuit on the load side of the actual machine with the stored theoretical circuit model, and performs an arithmetic operation based on matching conditions on the theoretical circuit model based on the measurement results of the actual machine. Then, the first and second variable capacitors VC1 and VC2 are simultaneously shifted from the results of the arithmetic operation to converge to a matching point.

Figure 2:
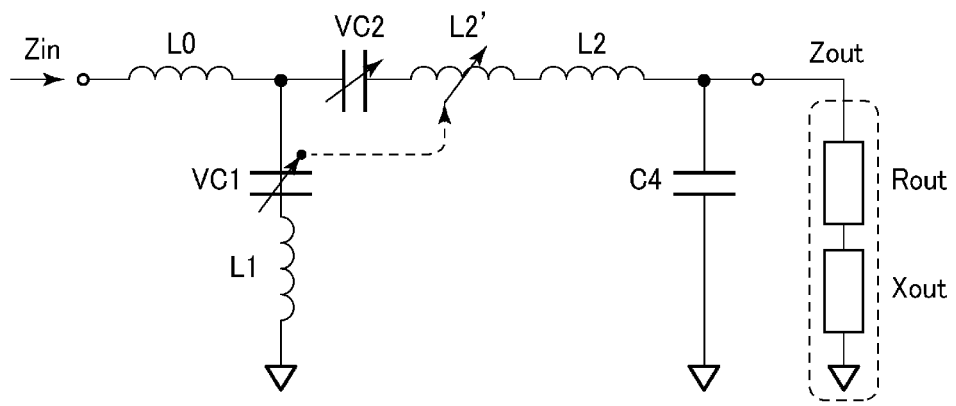
FIG. 2 is a circuit diagram illustrating a load side circuit model (an actual machine circuit model) including a matching circuit unit of the impedance matching device according to the first embodiment.

The circuit configuration on the load side including the matching circuit unit 12 of the impedance matching device 3 in the actual machine is predictable from values measured by an impedance analyzer, and a circuit model (an actual machine circuit model) at that time is, for example, as illustrated in FIG. 2. In FIG. 2, $Z_{in}$ is an input impedance, and $Z_{out}$ is an output impedance. However, as illustrated, the actual machine circuit model includes coils L0, L1, and L2, and a capacitor C4 in addition to the first variable capacitor VC1 and the second variable capacitor VC2. In addition, for forced correction to actual measurement, a variable coil L2' having a relationship indicated by a broken line with the first variable capacitor VC1 is introduced in series with the second variable capacitor VC2.

Figure 3:
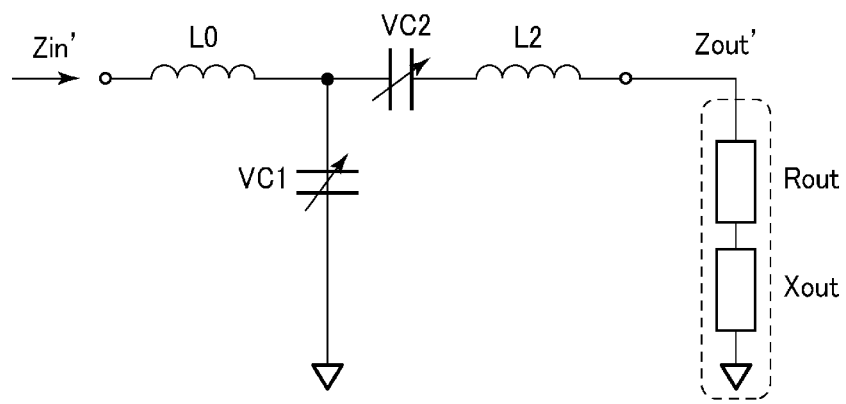
FIG. 3 is a circuit diagram illustrating an example of a theoretical circuit model of the impedance matching device according to the first embodiment.

As described above, since the circuit configuration of the actual machine circuit is complicated, in the present embodiment, the actual machine circuit is simulated and the simplified theoretical circuit model is stored in the controller 13 in consideration of, for example, the ease of operation. As a theoretical circuit model, for example, as illustrated in FIG. 3, a simpler and standard circuit model based on the actual machine circuit model of FIG. 2 is used. In FIG. 3, $Z_{in}'$ is an input impedance, and $Z_{out}'$ is an output impedance. As illustrated in FIG. 3, although the theoretical circuit model of this example is similar to the actual machine circuit model, the coil L1 and the capacitor C4 are eliminated from the actual machine circuit model, and a broken line portion for correction to actual measurement (the variable coil L2') is deleted.

Figure 4A:
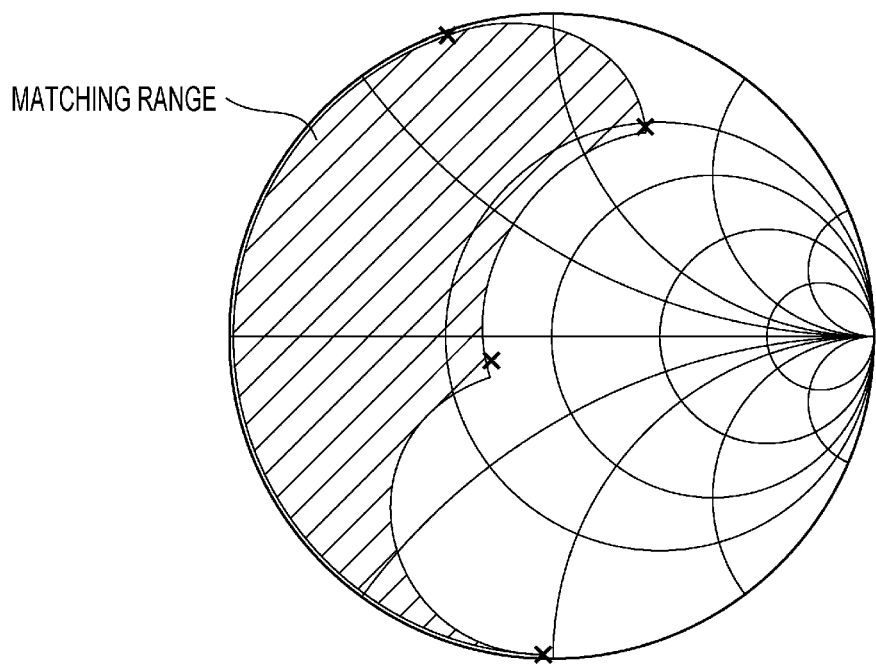
FIG. 4A is a diagram illustrating a load impedance matching range on a Smith chart by first and second variable capacitors VC1 and VC2 in the actual machine circuit model of FIG. 2.
Figure 4B:
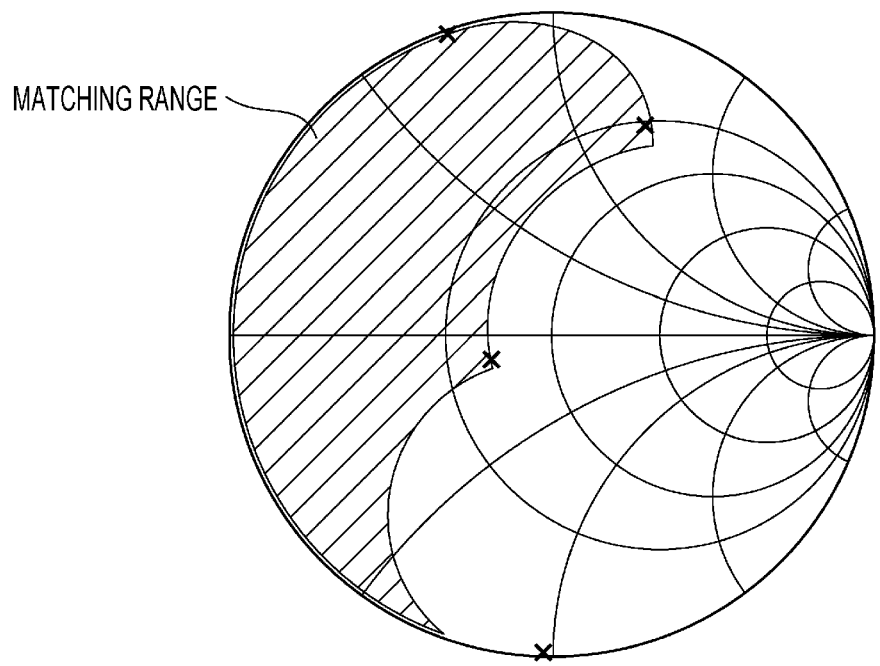
FIG. 4B is a diagram illustrating a load impedance matching range on a Smith chart by first and second variable capacitors VC1 and VC2 in the theoretical circuit model of FIG. 3.

FIGS. 4A and 4B are diagrams illustrating load impedance matching ranges on Smith charts by the first and second variable capacitors VC1 and VC2 in the theoretical circuit model of FIG. 3, respectively. As illustrated in these drawings, due to a difference in circuit configuration between the actual machine circuit model and the theoretical circuit model, load impedance matching areas are slightly different in the actual machine circuit model and the theoretical circuit model.

Figure 5:
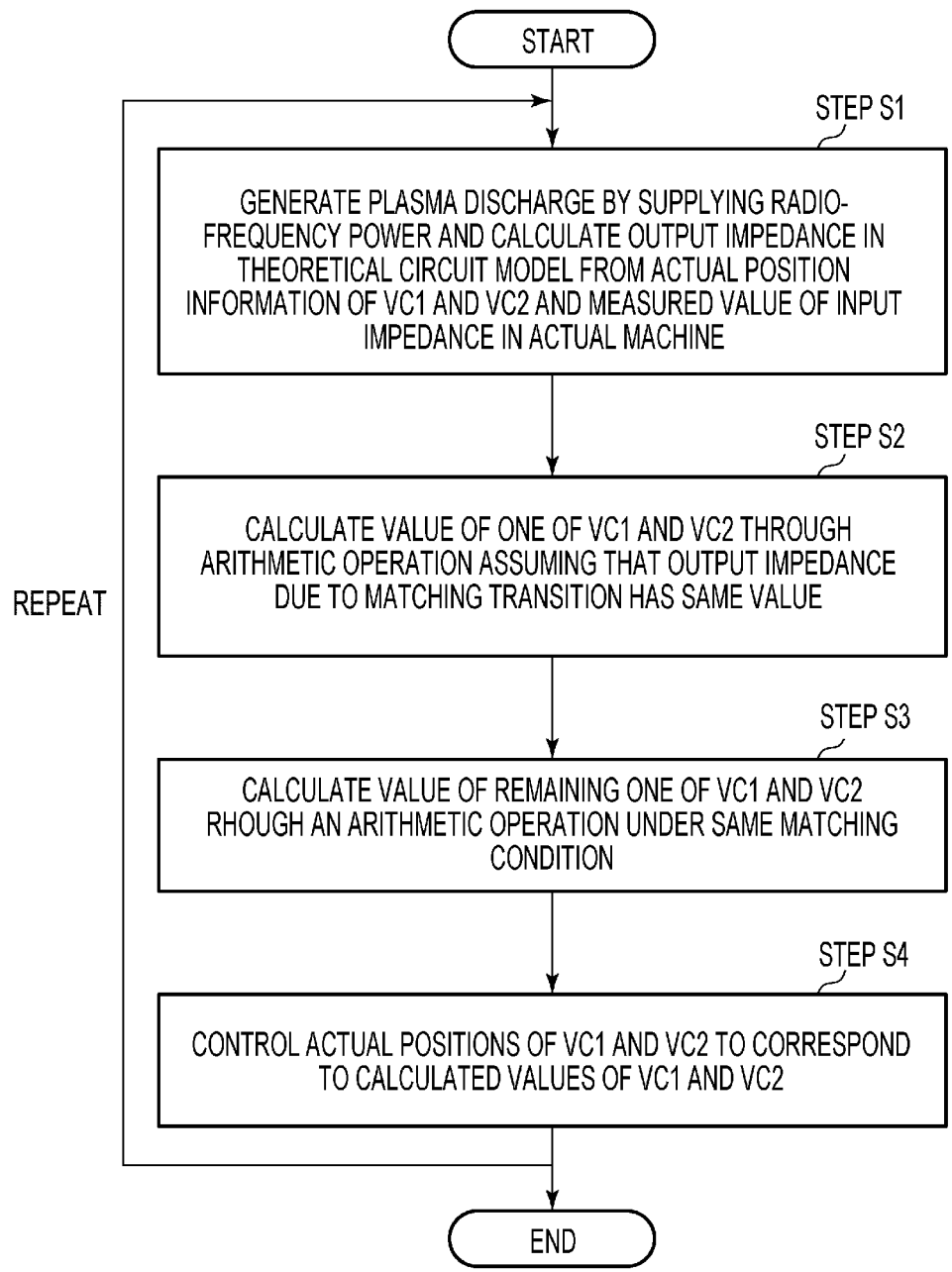
FIG. 5 is a flowchart illustrating an automatic matching algorithm in the first embodiment.

Next, in the first embodiment, an automatic matching algorithm executed based on the controller 13 will be described. FIG. 5 is a flowchart illustrating an automatic matching algorithm at that time.

First, when the first and second variable capacitors VC1 and VC2 of the impedance matching device 3 are present at arbitrary positions (capacitances), radio-frequency power is supplied from the radio-frequency power supply 2 to generate plasma discharge. In this state, the controller 13 calculates an output impedance $Z_{out}'$ in the theoretical circuit model based on the position information at the actual positions (capacitances) of the first and second variable capacitors VC1 and VC2 in the actual machine (a variable capacity ratio) and the measured value of the input impedance (step S1).

Next, the controller 13 assumes that the output impedance due to the matching transition has the same value, and, based on the calculated value of the output impedance $Z_{out}'$, the controller calculates one of the first and second variable capacitors VC1 and VC2 at the time of impedance matching through an arithmetic operation at a matching condition (input impedance=$50\Omega \pm 0j\Omega$) in the theoretical circuit model (step S2).

Then, based on the calculated value of one of the first and second variable capacitors VC1 and VC2 described above, the controller 13 calculates the value of the other of the second variable capacitors VC1 and VC2 at the time of impedance matching through an arithmetic operation under the same matching condition (step S3).

Then, the controller 13 controls the positions of the first and second variable capacitors VC1 and VC2 of the actual impedance matching device 3 to correspond to the values of the first and second variable capacitors VC1 and VC2 calculated in steps S2 and S3, respectively (step 4). In the actual impedance matching device 3, the positions of the first and second variable capacitors VC1 and VC2 are controlled to become percentages converted from the capacitance values thereof. For this reason, in step S4, the controller 13 controls the positions of the actual first and second variable capacitors VC1 and VC2 in the actual machine such that the positions become percentages corresponding to the capacitance values of VC1 and VC2 of the theoretical circuit model calculated in steps S2 and S3, respectively.

Since the matching areas are slightly deviated in the actual machine circuit model and the theoretical circuit model, a calculated value in the theoretical circuit may be deviated from the matching area. In this case, correction is made so as to make the calculated value enter the matching area.

When respective circuit constants of the actual machine circuit and the theoretical circuit model are the same and the load impedances thereof are also the same, complete matching (the absolute value of reflection coefficient $|\Gamma|=0$) is not reached at the end of step S4. However, in practice, since a standard circuit model different from the actual machine circuit model described above is used as the theoretical circuit model, the reflection coefficient becomes a value deviating from the matching point ($|\Gamma|=0$) at the end of step S4. Even if a theoretical circuit model closer to the actual machine circuit is used, complete matching is not reached only by performing steps S1 to S4 once due to the influence of, for example, a machine difference.

For this reason, steps S1 to S4 are repeated. By this, $|\Gamma|$ converges to the matching point, and finally reaches complete matching. As the differences between the theoretical circuit model and the actual machine circuit (a difference in circuit component and a difference in circuit constant (especially a difference in variable element value)) become larger, the number of repetitions increases, but it is possible to make the theoretical circuit model and the actual machine circuit eventually reach the complete matching.

When the positions of the two variable capacitors are alternately shifted as in Japanese Patent Laid-Open Publication No. 10-209789, an unnecessary operation such as, for example, hunting may occur, and the variable capacitors may reach an oscillation state depending on the situation.

In contrast, in the present embodiment, the circuit on the load side of the actual machine is substituted by a theoretical circuit model, and, based on the measurement result of the actual machine, an arithmetic operation is performed under matching conditions on the theoretical circuit model. Then, based on the arithmetic operation result, the first and second capacitors VC1 and VC2 are simultaneously shifted to converge to the matching point. Therefore, an unnecessary operation such as, for example, hunting, occurs, and it is possible to perform impedance matching in a short time.

In addition, even if the theoretical circuit model used for the arithmetic operation is different from the actual machine circuit, it is possible to make the theoretical circuit model reach the matching point by adjusting the number of repetitions of the steps S1 to S4. In contrast, by making the theoretical circuit model used for the arithmetic operation closer to the actual machine circuit within the range where the above arithmetic operation can be performed without difficulty, it is possible to reduce the number of repetitions of steps S1 to S4 so as to perform the matching operation in a shorter time.

[Simulation]

Next, simulation results will be described.

Simulation 1

In Simulation 1, simulation was performed using the actual machine circuit model illustrated in FIG. 2 and the theoretical circuit model illustrated in FIG. 3.

Here, the values of respective circuit constants of the actual machine circuit model illustrated in FIG. 2 were set as follows:

VC1: 270 to 2320 [pF]
VC2: 206 to 500 [pF]
C4: 24 [pF]
L1: 0.005 [pH]

In addition, the values of respective circuit constants of the theoretical circuit model illustrated in FIG. 3 were set as follows:

VC1: 300 to 2000 [pF]
VC2: 100 to 500 [pF]

In both the actual machine circuit model and the theoretical circuit model, L0 and L2 were set to the following same values, respectively.

L0: 0.300 [µH]
L2: 0.818 [µH]

Next, the procedure of Simulation 1 will be described.

Input impedance and variable element position conditions are input to the theoretical circuit model from the input impedance: $Z_{in}$ under a specific condition and the variable element (variable capacitor) position: X (%) at that time in the actual machine circuit model, and the load impedance: $Z_{out}'$ based on each circuit constant of the theoretical circuit model under these conditions is calculated. Next, a variable element value: X' (%) under the matching condition ($Z_{in}'=50\Omega$) in the theoretical circuit model is calculated by an arithmetic operation based on a matching theory. Next, the result is set to the actual machine circuit model, and calculates $|\Gamma|$. Then, this procedure is repeated.

A matching condition and a start condition are as follows.

When the matching condition is set as follows:
VC1=70.0%
VC2=30.0%
$Z_{out}$=0.77−j12.72Ω, the start condition is as follows:
VC1=80.0%,
VC2=40.0%,
$Z_{out}$=0.77−j12.72Ω

Here, it is assumed that there is no change in the output impedance $Z_{out}$ under the matching condition and the start condition. However, in practice, a change in input power to a load under a mismatched state causes a change in output impedance.

Figure 6:
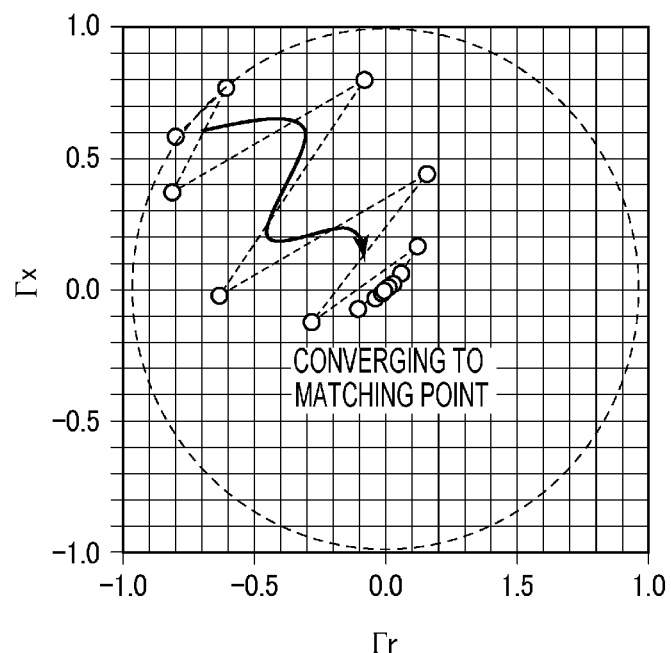
FIG. 6 is a diagram illustrating a reflectance when the procedure of Simulation 1 was repeated.
Figure 7:
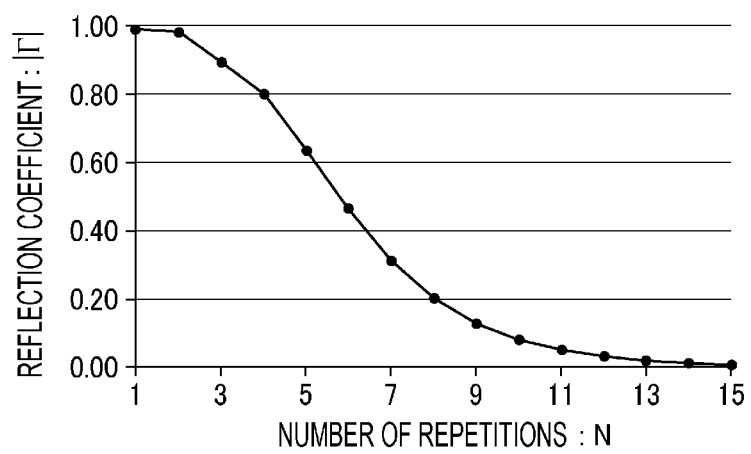
FIG. 7 is a diagram illustrating a relationship between the number of repetitions of the procedure of Simulation 1 and a reflection coefficient |Γ|.
Figure 8:
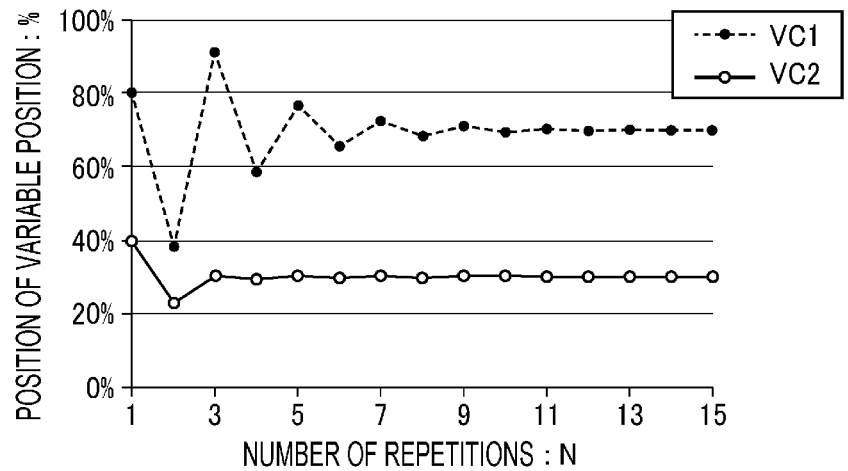
FIG. 8 is a diagram illustrating a relationship between the number of repetitions of the procedure of Simulation 1 and the position (%) of each variable element.

FIG. 6 is a diagram illustrating a reflectance when the procedure of Simulation 1 was repeated. Γr represents the real part of the reflection coefficient, and Γx represents the imaginary part of the reflection coefficient. Further, at the matching point, $|\Gamma|$=0. FIG. 7 is a diagram illustrating a relationship between the number of repetitions of the procedure of Simulation 1 and a reflection coefficient $|\Gamma|$. FIG. 8 is a diagram illustrating a relationship between the number of repetitions of the procedure of Simulation 1 and the position (%) of each variable element.

As illustrated in these drawings, it was confirmed that the convergence from the start condition of the reflection coefficient of 1.0 to the matching point in the actual machine circuit model is achieved by the arithmetic operation of the above procedure in Simulation 1. In addition, it was confirmed that the complete matching ($|\Gamma|$=0) is finally achieved by repeating this procedure.

Simulation 2

In Simulation 2, an actual machine circuit model, which is the same as that in Simulation 1, was used as the actual machine circuit model. In addition, as the theoretical circuit model, a theoretical circuit model, which is the same as the actual machine circuit model in the circuit configuration and the values of C4, L0, L1, and L2 and different from the actual machine circuit model only in the ranges of VC1 and VC2 as follows, was used. In addition, the simulation was performed in the same procedure as Simulation 1.

VC1: 250 to 2300 [pF]
VC2: 100 to 500 [pF]

The matching condition and the start condition are the same as Simulation 1.

Figure 9:
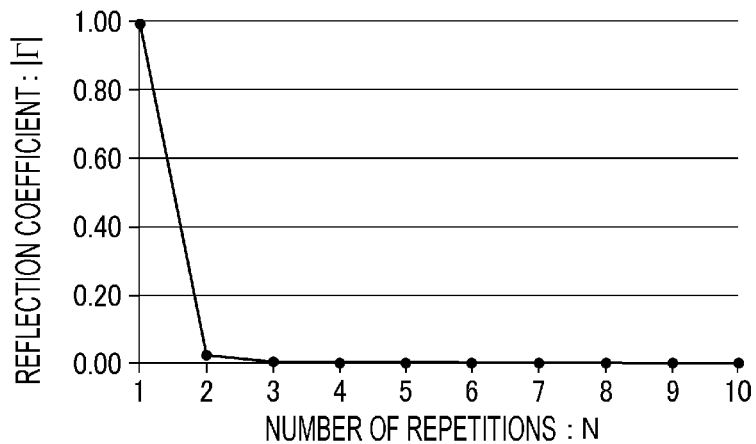
FIG. 9 is a diagram illustrating a relationship between the number of repetitions of the procedure of Simulation 2 and a reflection coefficient |Γ|.
Figure 10:
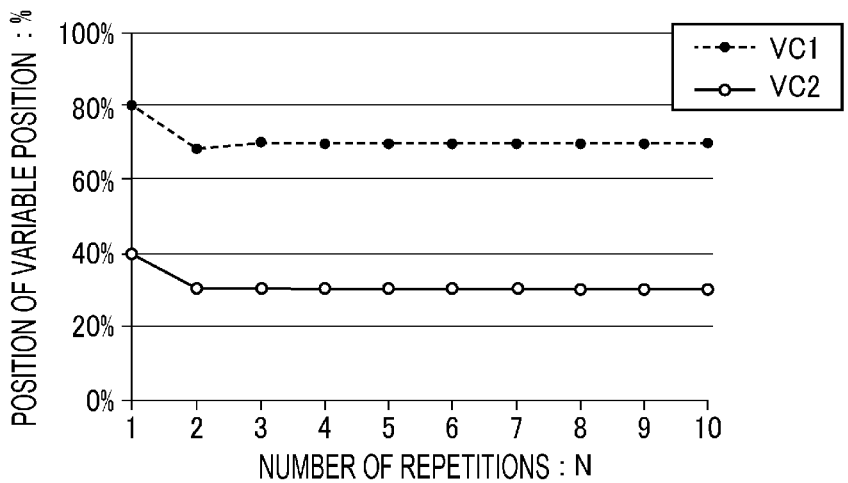
FIG. 10 is a diagram illustrating a relationship between the number of repetitions of the procedure of Simulation 2 and the position (%) of each variable element.

FIG. 9 is a diagram illustrating a relationship between the number of repetitions of the procedure of Simulation 2 and a reflection coefficient $|\Gamma|$. FIG. 10 is a diagram illustrating a relationship between the number of repetitions of the procedure of Simulation 2 and the position (%) of each variable element.

As illustrated in these drawings, it was confirmed that, by using the theoretical circuit model in which the circuit configuration and the value of each circuit element are close to those of the actual machine circuit model, it is possible to reduce the number of repetitions until reaching the matching point compared with that in Simulation 1.

Simulation 3

Figure 11:
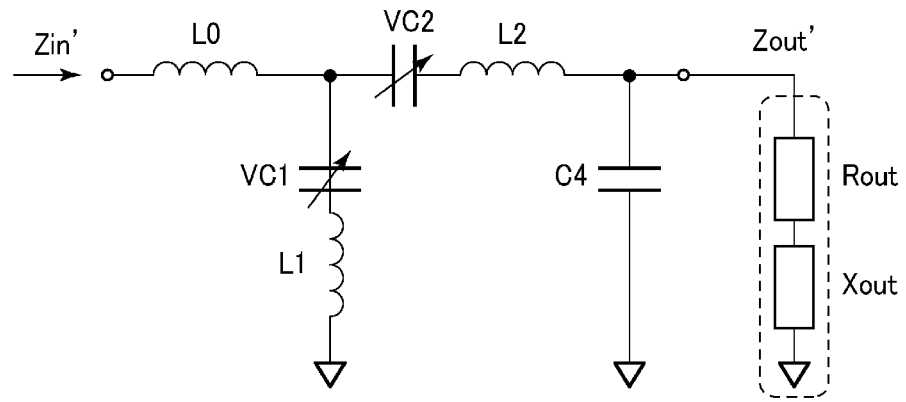
FIG. 11 is a circuit diagram illustrating a theoretical circuit model used for Simulation 2.

In Simulation 3, as the actual machine circuit model, an actual machine circuit model, which is the same as that in Simulation 1, was used. In addition, as the theoretical circuit model, a theoretical circuit model, in which a portion not included in the theoretical circuit indicated by a broken line is deleted from the actual machine circuit model, as illustrated in FIG. 11, and each circuit constant is approximated to that in the actual machine circuit model, was used.

The values of respective circuit constants of this theoretical circuit model were set as follows.

VC1: 300 to 2300 [pF]
VC2: 100 to 500 [pF]
C4: 20 [pF]
L0: 0.300 [µH]
L1: 0.005 [µH]
L2: 1.000 [µH]

The start condition and the matching condition are the same as Simulation 1.

Figure 12:
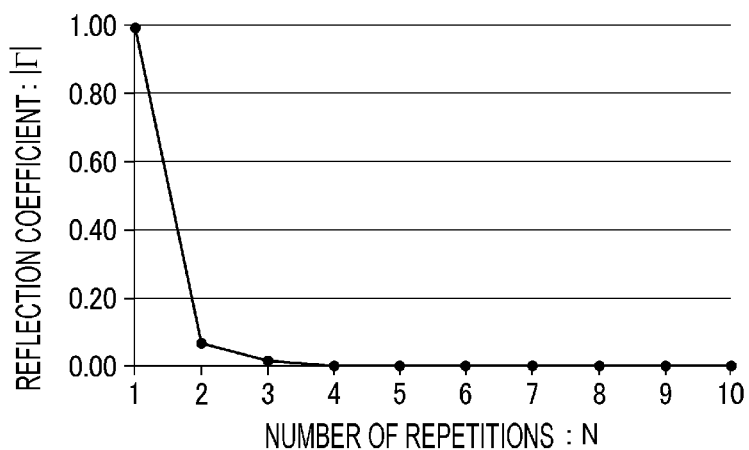
FIG. 12 is a diagram illustrating a relationship between the number of repetitions of the procedure of Simulation 3 and a reflection coefficient |Γ|.
Figure 13:
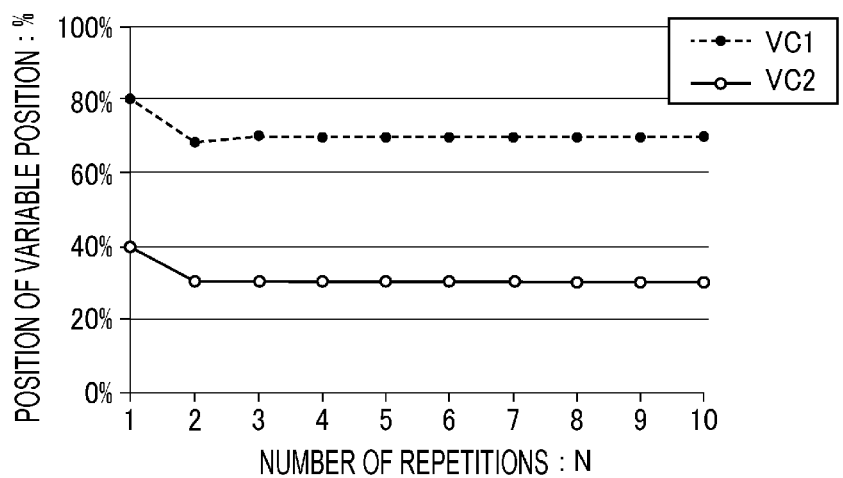
FIG. 13 is a diagram illustrating a relationship between the number of repetitions of the procedure of Simulation 3 and the position (%) of each variable element.

FIG. 12 is a diagram illustrating a relationship between the number of repetitions of the procedure of Simulation 3 and a reflection coefficient $|\Gamma|$. FIG. 13 is a diagram illustrating a relationship between the number of repetitions of the procedure of Simulation 3 and the position (%) of each variable element.

As illustrated in these drawings, it was confirmed that, by using the theoretical circuit model illustrated in FIG. 11, the number of repetitions until reaching the matching point is reduced compared with that in Simulation 1 even though the number of repetitions is larger than that in Simulation 2. That is, it was confirmed that, by using the theoretical circuit model in which the value of each circuit element is close to that in the actual machine circuit model and a portion not included in the theoretical circuit indicated by the broken line is deleted, the number of repetitions until reaching the matching point is reduced. It is considered that the pseudo characteristic of the VC1+L1 on the parallel side with the actual machine circuit model is attributed to the convergence to the matching point.

[Arithmetic Operation Procedure]

Next, an example of a specific arithmetic operation procedure of steps S1 to S3 in the first embodiment will be described. Here, an example using the one illustrated in FIG. 3 as the theoretical circuit model is illustrated.

First, the arithmetic operation of the output impedance in step S1 will be described.

Figure 14:
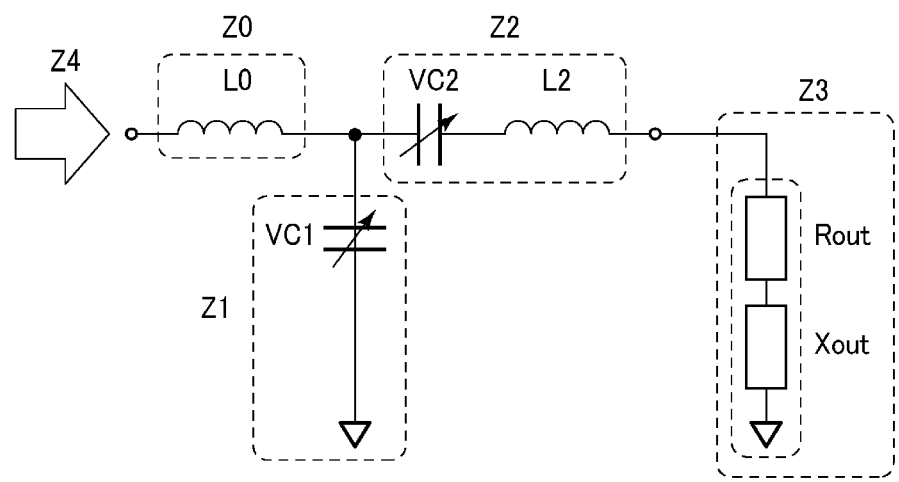
FIG. 14 is a diagram illustrating a state in which a theoretical circuit model is classified into impedance locks Z0 to Z4 in calculation of output impedance of the first embodiment.

The theoretical circuit model is divided into impedance blocks Z0 to Z4 as illustrated in FIG. 14. Z3 is the output impedance $Z_{out}$ which Z3 which is to be obtained. The output impedance Z3 is a load impedance after the output of the impedance matching device 3 (after the output port P2). Since the variable elements VC1 and VC2 have specific fixed values and L0 and L2 are also already known, Z0, Z1, and Z2 are already known. When the input impedance $Z_{in}$ measured by the above-described impedance measurement unit 11 is Z4, it is possible to calculate Z3 from Z0 and Z0, Z1, and Z2, which are already known.

Figure 15:
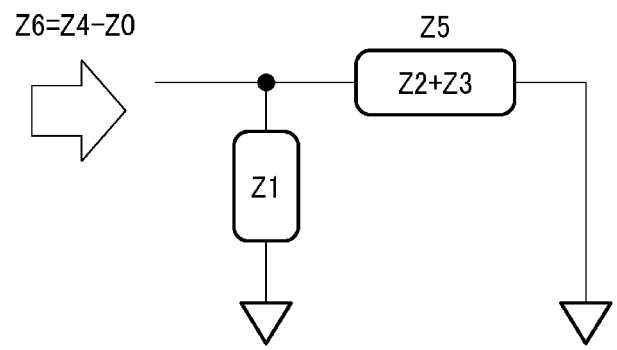
FIG. 15 is a diagram illustrating impedance blocks obtained by further simplifying the impedance blocks of FIG. 14.

In order to perform one-stage parallel arithmetic operation, as illustrated in FIG. 15, Z2 and Z3 connected in series are assumed as Z2+Z3=Z5, and the impedance (Z4−Z0) obtained by subtracting Z0 of the serial connection portion from Z4, which is the input impedance, is assumed as Z6. In this case, a relational expression of Z6=Z5//Z1 is established. The output impedance Z3 to be obtained may be calculated by calculating Z5 from this one-stage parallel circuit through parallel decomposition arithmetic operation, and subtracting the value of Z2 from Z5.

Figure 16:
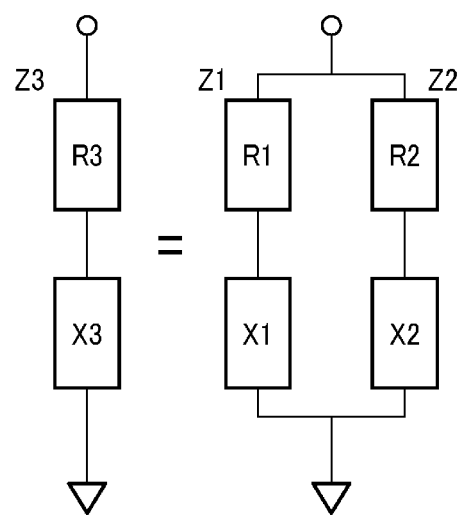
FIG. 16 is a diagram for explaining a parallel decomposition operation.

The parallel decomposition arithmetic operation is an arithmetic operation for obtaining a serial element Z1 on one side from approximate values Z2 and Z3 when there is a relation of Z3=Z1//Z2 as in FIG. 16.

When there is a relationship of Z3=Z1//Z2, Z3=(Z1*Z2)/(Z1+Z2) is established from the relational expression of parallel-serial conversion.

When this is converted into an equation for obtaining a serial element on one side, Z1=(Z2*Z3)/(Z2−Z3) is obtained.

From Z=R+jX, Z1={(R2+jX2)*(R3+jX3)}/{(R2−R3)+j(X2−X3)}.

When the numerator and the denominator are multiplied by the complex conjugate on the denominator side, the denominator side imaginary part is canceled, the numerator and the denominator are expanded, and Z1 is decomposed into a real part R1 and an imaginary part X1, the following equations (1) and (2) are obtained.

$$R1=(R2*R3-X2*X3)*(R2-R3)+(R3*X2+R2*X3)*(X2-X3)\}/\{(R2-R3)^2+(X2-X3)^2\} \quad (1)$$

$$X1=(R2*X3+R3*X2)*(R2-R3)-(R2*R3-X2*X3)*(X2-X3)\}/\{(R2-R3)^2+(X2-X3)^2\} \quad (2)$$

Next, the calculation procedure of VC1 based on a matching condition will be described.

Figure 17:
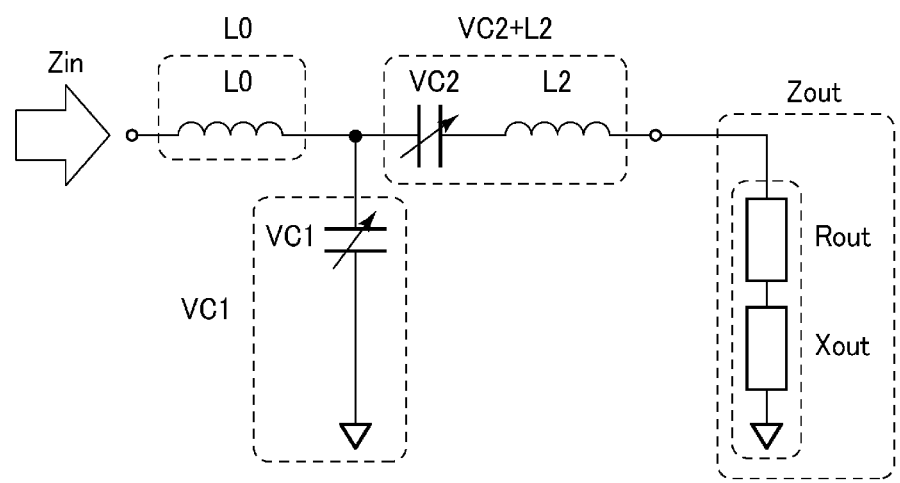
FIG. 17 is a diagram illustrating a state in which calculation of VC1 based on matching conditions of the first embodiment is classified into $Z_{in}$, L0, VC1, VC2+L2, and $Z_{out}$.
Figure 18:
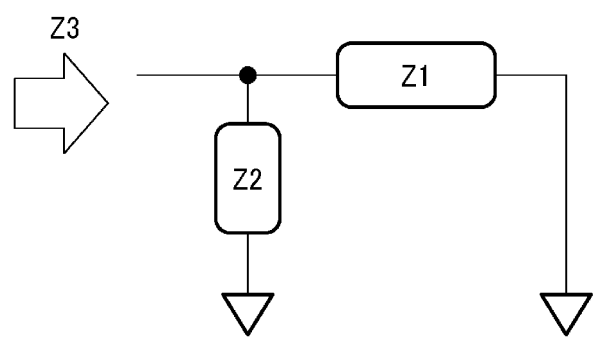
FIG. 18 is a diagram illustrating impedance blocks obtained by further simplifying the impedance blocks of FIG. 14.

The theoretical circuit model is divided into impedance blocks $Z_{in}$, L0, VC1, VC2+L2, and $Z_{out}$, as illustrated in FIG. 17. Then, as illustrated in FIG. 18, VC2, L2, and $Z_{out}$ connected in series are assumed as Z1, VC1 is assumed as Z2, and an impedance obtained by subtracting Z0 of the serial connection site from $Z_{in}$ is assumed as Z3.

From Z3=$Z_{in}$−L0, R3=$R_{in}$, and X3=$X_{in}$−L0. Since the matching condition is that $R_{in}$=50 and $X_{in}$=0, R3=50 and X=−L0.

Since Z2=VC1, R2=0 and X2=VC1.

From Z1=VC2+L2+$Z_{out}$, R1=$R_{out}$ and X1=VC2+L2+$X_{out}$.

Upon Substituting R2=0 into the above equation (1) obtained through parallel decomposition arithmetic operation based on the relational expression of Z3=Z1//Z2, the following equation is obtained.

$$R1=\{(-X2*X3)*(-R3)+(R3*X2)*(X2-X3)\}/\{(R3)^2+(X2-X3)^2\}$$

From this equation, the following equation is derived.

$$(R1-R3)X2^2+(-2*R1*X3)X2+R1(R3^2+X3^2)=0$$

This equation becomes the following quadratic equation, where X2 is x.

$$ax^2+bx+c=0$$

From the solution of the quadratic equation, the following is obtained.

$$x=(-b\pm(b^2-4*a*c))^{1/2}/2*a$$

$$a=R1-R3$$

$$b=-2*R1*X3$$

$$c=R1(R3^2+X3^2)$$

However, it is necessary to determine whether x is + or −.

As described above, R1=$R_{out}$, and $R_{out}$ is a value obtained by the above arithmetic operation, and is, for example, 0.5. In addition, as described above, from the matching condition, R3=50 and X3=−L0. For example, X3 is −25.56. X1 is undefined but is not included in this equation.

From the above, it is possible to calculate X2, i.e., VC1.

By obtaining the value of VC1 in this manner, it is also possible to calculate the value of another variable element VC2. That is, it is possible to obtain VC2 by substituting the value of X2 (=VC1) into Equation (2) above and further substituting R2=0.

Next, the calculation procedure of VC2 based on the matching condition will be described.

Figure 19:
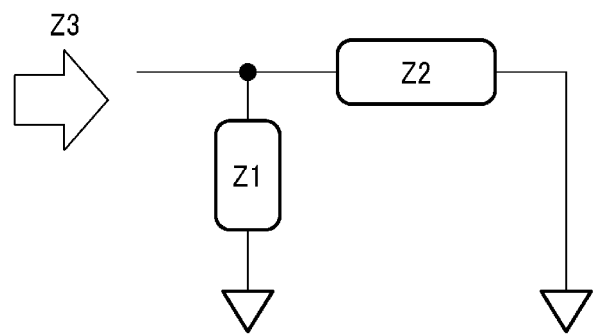
FIG. 19 is a diagram illustrating impedance blocks obtained by further simplifying the impedance blocks of FIG. 14 in calculating VC2 based on the matching conditions of the first embodiment.

Here, as illustrated in FIG. 19, VC1 is assumed as Z1, and VC2+L2+$Z_{out}$ is assumed as Z2 contrary to the case of calculating VC1. Z3 is an impedance obtained by similarly subtracting Z0 of the series connection portion from $Z_{in}$.

From Z3=$Z_{in}$−L0, R3=$R_{in}$ and X3=$X_{in}$−L0. Since the matching condition is that $R_{in}$=50 and $X_{in}$=0, R3=50 and X=−L0.

Since Z1=VC1, R1=0 and X1=VC1.

From Z2=VC2+L2+$Z_{out}$, R2=$R_{out}$ and X2=VC2+L2+$X_{out}$.

Since R1=0 in the above Equation (1) obtained through the parallel decomposition operation based on the relational expression Z3=Z1//Z2, the following is established as the numerator-only condition.

$$\{(R2*R3-X2*X3)*(R2-R3)+(R3*X2+R2*X3)*(X2-X3)\}=0.$$

From this equation, $$X2^2=(R2*R3^2-R2^2*R3+R2*X3^2)/R3$$

$$X2=\pm\{(R2*R3^2-R2^2*R3+R2*X3^2)/R3\}^{1/2}$$

However, it is necessary to determine whether X2 is + or −.

As described above, since $X2=VC2+L2+V_{out}$, $VC2=X2-L2-X_{out}$, and, by substituting the above value into X2 of this equation, it is possible to obtain VC2.

By obtaining the value of VC2 in this manner, it is also possible to calculate the value of another variable element VC1. That is, it is possible to obtain VC1 by substituting the value of X1 into the Equation (2) above and further substituting X1=VC1.

Second Embodiment

Figure 20:
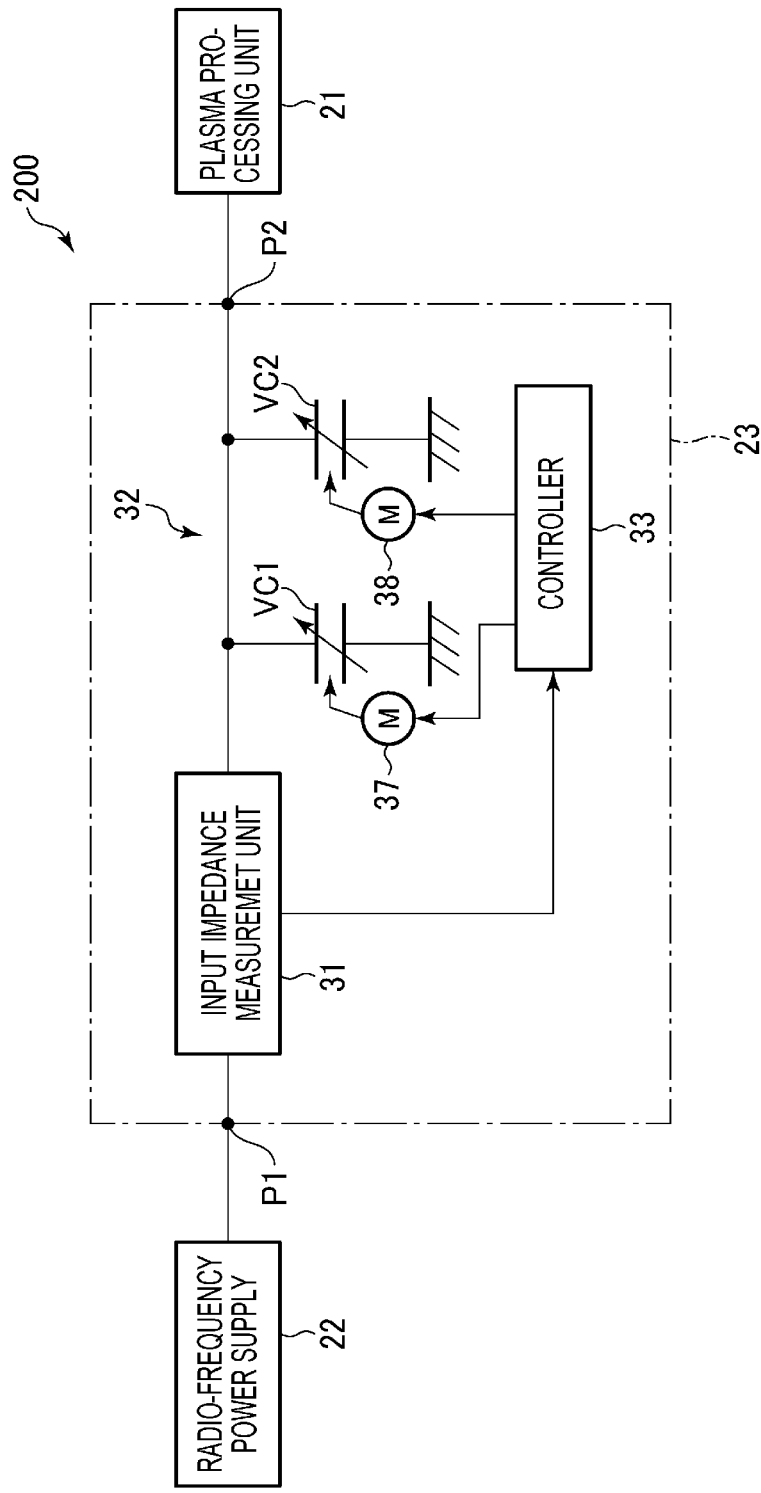
FIG. 20 is a block diagram illustrating a plasma processing apparatus including an impedance matching device according to a second embodiment.

FIG. 20 is a block diagram illustrating a plasma processing apparatus including an impedance matching device according to a second embodiment.

A plasma processing apparatus 200 of the present embodiment includes a plasma processing unit 21, a radio-frequency power supply 22 configured to supply radio-frequency power to the plasma processing unit 21, and an impedance matching device 23 provided between the radio-frequency power supply 22 and the plasma processing unit 21.

The plasma processing unit 21 has a chamber configured to accommodate a substrate to be processed and an electrode. By supplying radio-frequency power from the radio-frequency power supply 22 to the electrode, plasma is generated in the chamber.

The impedance matching device 23 is for automatically matching the radio-frequency power supply side impedance with the load (e.g., an electrode, plasma, or chamber) side impedance, and includes an input impedance measurement unit 31, a matching circuit unit 32, and a controller 33.

In the present embodiment, the impedance matching device 23 is configured in a π type. That is, as variable elements which are two variable components used for impedance matching, the matching circuit unit 32 includes a first variable capacitor VC1 and a second variable capacitor VC2 each connected in parallel with the load on the plasma processing unit 21 side with respect to the radio-frequency power supply 22. Positions defining the capacitances of the first variable capacitor VC1 and the second variable capacitor VC2 are adjusted by step motors 37 and 38, respectively.

Since the radio-frequency power supply 22 and the transmission cable are usually designed to have a pure resistance output of 50Ω, the controller 33 controls the step motors 37 and 38 such that the impedance on the load side in which the impedance matching device 23 is also included is 50Ω. That is, the step motors 37 and 38 function as variable units. The other circuit components of the matching circuit unit 32 are omitted here.

The input impedance measurement unit 31 is provided at the input portion of the impedance matching device 23, that is, at the front stage of the matching circuit unit 32, and measures the input impedance viewed from the input portion of the impedance matching device 23. The input impedance measurement unit 31 is configured to be the same as the input impedance measurement unit 11 of the first embodiment.

The controller 33 stores a theoretical circuit model that simulates a network on the load side in which the matching circuit unit 32 in an actual machine is included.

Figure 21:
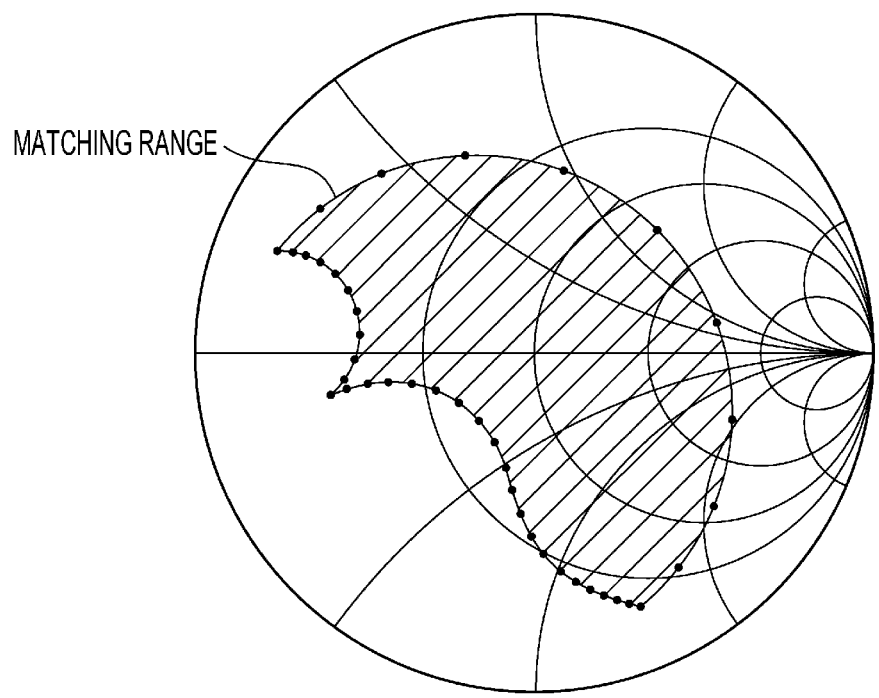
FIG. 21 is a diagram illustrating a load impedance matching range on a Smith chart in the impedance matching device of FIG. 20.

In the present embodiment, like the controller 13 of the first embodiment, the controller 33 substitutes the circuit on the load side in the actual machine with the stored theoretical circuit model, and performs an arithmetic operation based on matching conditions on the theoretical circuit model based on the measurement results of the actual machine. Then, the first and second variable capacitors VC1 and VC2 are simultaneously shifted from the results of the arithmetic operation to converge to a matching point. A load impedance matching range on a Smith chart by the first and second variable capacitors VC1 and VC2 are represented in FIG. 21.

Figure 22:
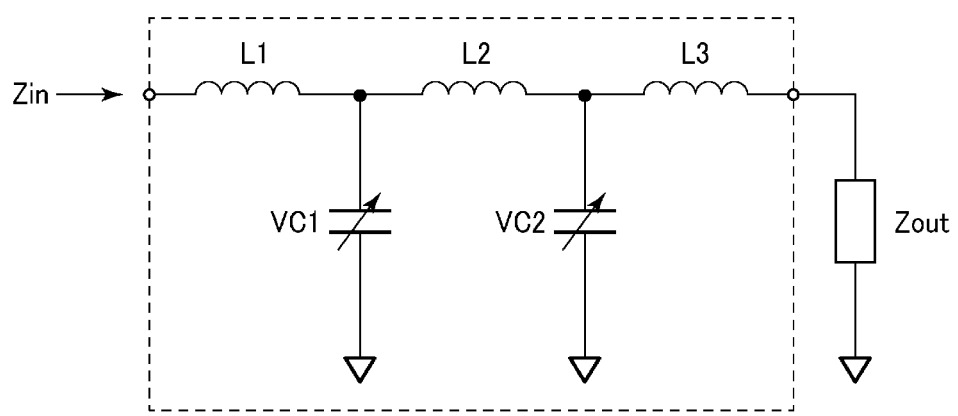
FIG. 22 is a circuit diagram illustrating an example of a theoretical circuit model of the impedance matching device according to the second embodiment.

Also in the present embodiment, since the circuit configuration on the load side in which the matching circuit unit 32 of the impedance matching device 23 in the actual machine is included is complicated, a simplified theoretical circuit model simulating the circuit configuration of the actual device is stored in the controller 33 in consideration of facilitation of calculation. As the theoretical circuit model, for example, a standard circuit model illustrated in FIG. 22 is used. In FIG. 22, $Z_{in}$ is an input impedance, and $Z_{out}$ is an output impedance.

In the present embodiment, an automatic matching algorithm executed based on the controller 33 is basically the same as that in the first embodiment.

That is, first, when the first and second variable capacitors VC1 and VC2 of the impedance matching device 23 are present at arbitrary positions (capacitances), radio-frequency power is supplied from the radio-frequency power supply 22 to generate plasma discharge. In this state, the controller 33 executes the same steps S1 to S4 as in the first embodiment, and repeats these steps S1 to S4. By this, |Γ| converges to the matching point, and finally reaches complete matching. As the differences between the theoretical circuit model and the actual machine circuit (a difference in circuit component and a difference in circuit constant (especially, a difference in variable element value)) become larger, the number of repetitions increases, but it is possible to make the theoretical circuit model and the actual machine circuit eventually reach the complete matching.

In the present embodiment as well, as in the first embodiment, the circuit on the load side in the actual machine is substituted with the theoretical circuit model, and an arithmetic operation based on matching conditions on the theoretical circuit model is performed based on the measurement results of the actual machine. Then, the first and second variable capacitors VC1 and VC2 are simultaneously shifted from the results of the arithmetic operation to converge to a matching point. Therefore, an unnecessary operation such as, for example, hunting, occurs, and it is possible to perform impedance matching in a short time.

In addition, even if the theoretical circuit model used for the arithmetic operation is different from the actual machine circuit, it is possible to make the theoretical circuit model reach the matching point by adjusting the number of repetitions of the steps S1 to S4. In contrast, by making the theoretical circuit model used for the arithmetic operation closer to the actual machine circuit within the range where the above arithmetic operation can be performed without difficulty, it is possible to perform the matching operation in a shorter time by reducing the number of repetitions of steps S1 to S4.

[Arithmetic Operation Procedure]

Next, an example of a specific arithmetic operation procedure of steps S1 to S3 in the second embodiment will be described. As the theoretical circuit, the one illustrated in FIG. 22 is illustrated.

First, the arithmetic operation of the output impedance in step S1 will be described.

Figure 23:
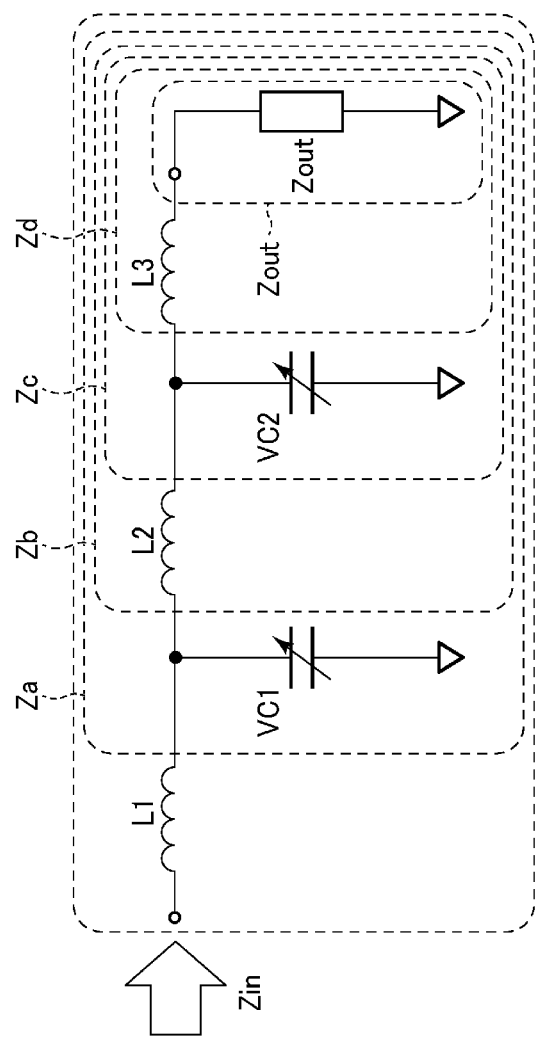
FIG. 23 is a diagram illustrating differences which are taken from the input side with respect to the impedance of the entire network viewed from the input side in the theoretical circuit model in the calculation of the output impedance according to the second embodiment.

FIG. 23 illustrates differences which are taken from the input side as follows when the impedance of the entire network viewed from the input side is $Z_{in}$ in a theoretical circuit model.

L1 difference: $Za=Z_{in}-1$

VC1 difference: $Zb=Za-//VC1$ (parallel decomposition arithmetic operation)

L2 difference: $Zc=Zb-L2$

VC2 difference: $Zd=Zc-//VC2$ (parallel decomposition arithmetic operation)

L3 difference: $Z_{out}=Zd-L3$

As described above, by performing a differential processing from the input side, it is possible to calculate an output impedance $Z_{out}$ which is a load impedance after the output of the impedance matching device 3 (after the output port P2).

At a parallel connection portion, it is possible to obtain a serial element on one side by performing the parallel decomposition arithmetic operation as described above. For example, assuming that $Za=Z_{in}-L1$ is Z3 and VC1 in parallel connection is Z1 in order to perform the first-stage parallel decomposition arithmetic operation, a relational expression of $Z3=Z1//Z2$ as illustrated in FIG. 19 is established by setting the impedance after L2 to Z2. Thus, it is possible to calculate Z2 through the parallel decomposition arithmetic operation.

Next, the calculation procedure of VC1 and VC2 based on the matching condition will be described.

1. Calculation of VC1 and VC2 Based on $Z_{in}$ and $Z_{out}$

Figure 24:
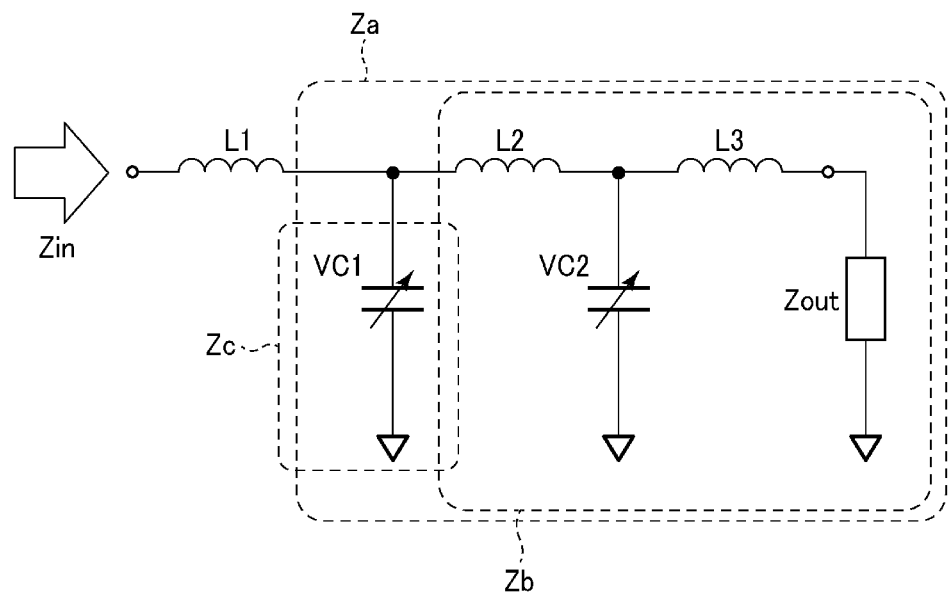
FIG. 24 is a diagram for describing calculation of VC1 based on $Z_{in}$ and $Z_{out}$ in calculation of VC1 and VC2 under a matching condition according to the second embodiment.

When VC1 is calculated, as illustrated in FIG. 24, it is assumed that the combined impedance up to the VC1 input is Za, the combined impedance after the VC1 output is Zb, and the impedance of VC1 is Zc. Then, first, Za and Zb are calculated.

Figure 25:
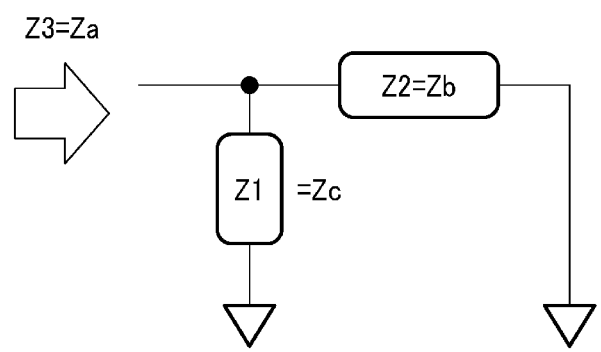
FIG. 25 is a diagram schematically illustrating a connection relationship between Za, Zb, and Zc in FIG. 24 in a simplified form.

Za, Zb, and Zc have a connection relationship as illustrated in FIG. 25, and assuming that Za=Z3, Zb=Z2, and Zc=Z1, a relational expression of $Z3=Z1//Z2$ is established. Therefore, the impedance of VC1 is obtained through parallel decomposition arithmetic operation. At this time, it is confirmed that resistance Rc=0.

Figure 26:
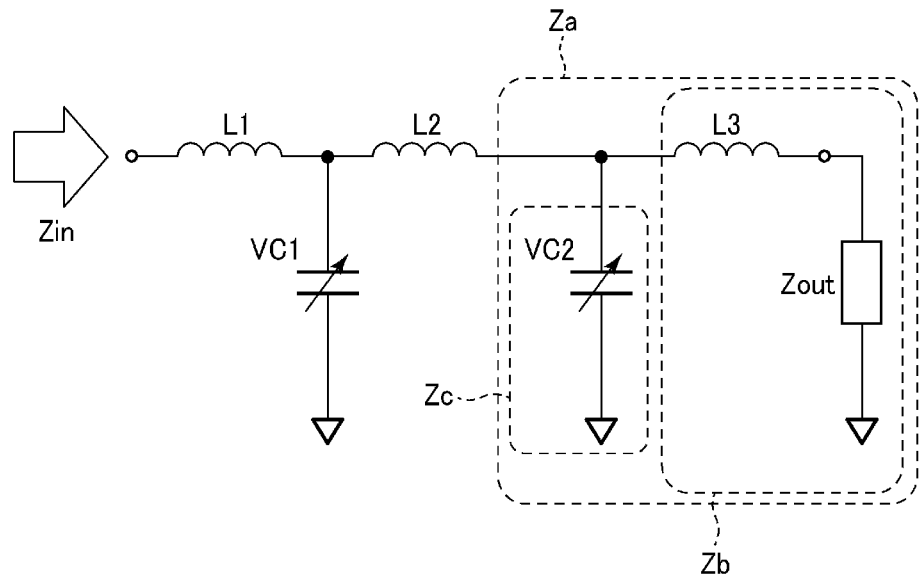
FIG. 26 is a diagram for describing calculation of V2 based on $Z_{in}$ and $Z_{out}$ in calculation of VC1 and VC2 under a matching condition according to the second embodiment.

When VC2 is calculated, as illustrated in FIG. 26, it is assumed that the combined impedance up to the VC2 input is Za, the combined impedance after the VC1 output is Zb, and the impedance of VC2 is Zc. Then, first, Za and Zb are calculated.

Za, Zb, and Zc have a connection relationship as illustrated in FIG. 25, and assuming that Za=Z3, Zb=Z2, and Zc=Z1, a relational expression of $Z3=Z1//Z2$ is established. Therefore, the impedance of VC2 is obtained through parallel decomposition arithmetic operation. At this time, it is confirmed that resistance Rc=0.

Figure 27:
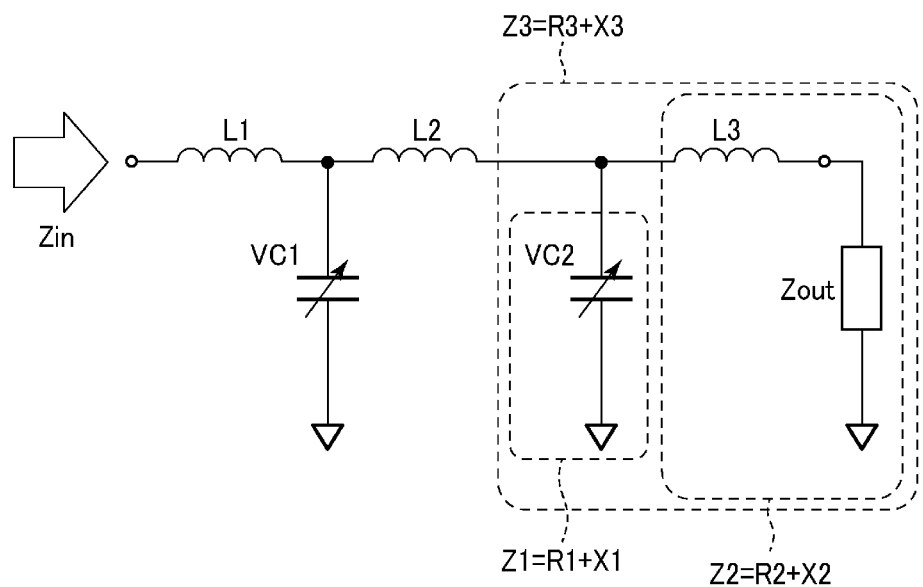
FIG. 27 is Analysis Diagram 1 in the case of using simultaneous equations based on two VC1/VC2 parallel connection points in calculation of VC1 and VC2 under a matching condition of the second embodiment.

2. When Using Simultaneous Equations Based on Two VC1/VC2 Parallel Connection Points FIG. 27 is Analysis Diagram 1 for explaining how to obtain a solution when using simultaneous equations. In FIG. 27, Z1 is the impedance of VC2, Z2 is the combined impedance after the VC2 output, and Z3 is the combined impedance up to the VC2 input.

From FIG. 27, the following is established.

$$Z3=Z1//Z2$$

$$Z1=R1+X1, R1=0, X1=VC2$$

$$Z2=R2+X2, R2=R_{out}, X2=X_{out}+L3$$

From the parallel decomposition arithmetic operation, as represented in Equation (1) described above, the following is established.

$$R1=(R2*R3-X2*X3)*(R2-R3)+(R3*X2+R2*X3)*(X2-X3)\}/\{(R2-R3)^2+(X2-X3)^2\}$$

Since R1=0, the following Equation (3) is established as a numerator-only condition.

$$(R2*R3-X2*X3)*(R2-R3)+(R3*X2+R2*X3)*(X2-X3)=0 \quad (3)$$

Here, R2 and X2 are approximate values, and R3 and X3 are undefined relational expressions including VC1.

Figure 28:
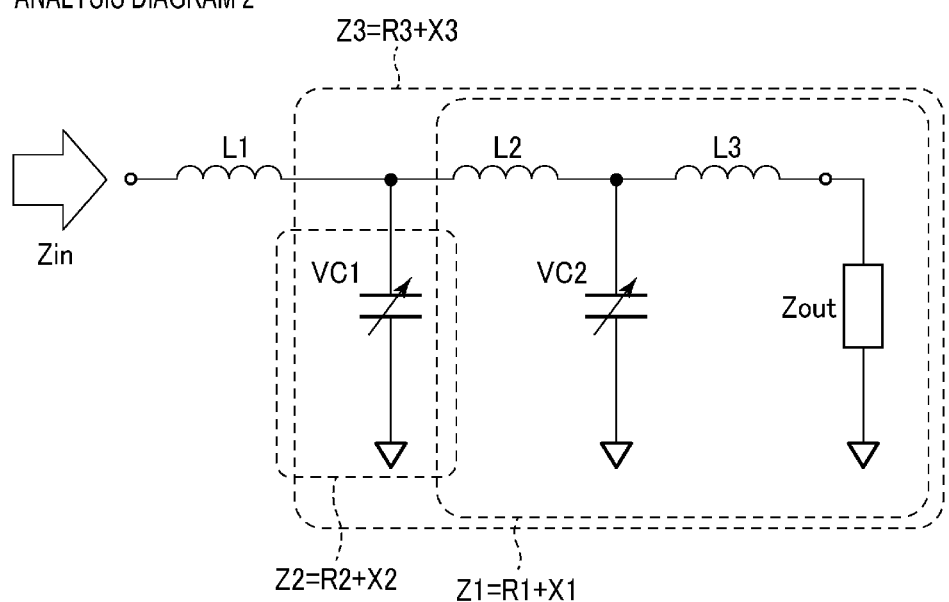
FIG. 28 is Analysis Diagram 2 in the case of using simultaneous equations based on two VC1/VC2 parallel connection points in calculation of VC1 and VC2 under a matching condition of the second embodiment.

FIG. 28 is Analysis Diagram 2 for explaining how to obtain a solution using simultaneous equations. In FIG. 28, Z1 is the combined impedance after the VC1 output, Z2 is the impedance of VC1, and Z3 is the combined impedance up to the VC1 input.

In FIG. 28, the following is established.

$$Z3=Z1//Z2$$

$$Z3=R3+X3, R3=R_{in}, X3=X_{in}-L1$$

$$Z2=R2+X2, R2=0, X2=VC1$$

$$Z1=R1+X1, R1=R3', X1=X3'+L2$$

(here, R3' and X3' are the same as R3 and X3 in Analysis Diagram 1)

From the parallel decomposition arithmetic operation, as represented in Equations (1) and (2) described above, the following is established.

$$R1=\{(R2*R3-X2*X3)*(R2-R3)+(R3*X2+R2*X3)*(X2-X3)\}/\{(R2-R3)^2+(X2-X3)^2\}$$

$$X1=\{(R2*X3+R3*X2)*(R2-R3)-(R2*R3-X2*X3)*(X2-X3)\}/\{(R2-R3)^2+(X2-X3)^2\}$$

Substituting R2=0 into this condition leads to the following Equations (4) and (5).

$$R1=R3*X2^2/\{(X2-X3)^2+R3^2\}\} \quad (4)$$

$$X1=(-R3^2*X2+X2^2*X3-X2*X3^2)/\{(X2-X3)^2+R3^2\}. \quad (5)$$

In order to set Equations (3) to (5) described above as simultaneous equations, respective parameters are changed and matched.

In Equation (3), it is assumed that R2=a, X2=b, R3=R, and X3=X. Then, Equation (3) described above becomes Equation (3)' as follows.

$$(a*R-b*X)*(a-R)+(a*X+b*R)*(b-X)=0 \quad (3)'$$

In Equations (4) and (5), it is assumed that R1=R and X=X1−X4(X4=L2). Then, Equations (4) and (5) described above become Equations (4)' and (5)' as follows.

$$R=R3*X2^2/\{(X2-X3)^2+R3^2\}\} \quad (4)'$$

$$X=[-R3^2*X2+X2^2*X3-X2*X3^2-X4*\{(X2-X3)^2+R3^2\}]/\{(X2-X3)^2+R3^2\} \quad (5)'$$

Upon substituting Equations (4)' and (5)' into Equation (3)', Equation (6) is obtained as follows.

$$+\{(a2+b2)*R3-a*(R3^{2'}X3^2-2*X3*X4+X4^2)\}*X2^4+ \quad (6)$$
$$\{-2*(a2+b2)*R3*X3-a*(-2*R3^2*X3-2*X3^3+$$
$$6*X3^2*X4-4*X3*X4^2+2*R3^2*X4)\}*$$
$$X2^3+\{(a2+b2)*(R3*X3^2+R3^3)-$$
$$a*(R3^4+2*R3^2*X3^2-6*X3^3*X4-6*R3^2*X3*X4+$$
$$X3^4+6*X3^2*X4^2+2*R3^2*X4^2)\}*X2^2+$$
$$\{-1*a*(2*R3^4*X4+2*X3^4*X4+4*R3^2*X3^2*X4-$$
$$4*X3^3*X4^2-4*R3^2*X3*X4^2)\}*X2+$$
$$\{-1*a*(X3^4*X4^2+2*R3^2*X3^2*X4^2+R3^4*X4^2)\}=0$$

This equation becomes the following quadratic equation, where X2 is x.

$$ax4+bx3+cx2+dx+e=0$$

Here, since a=$R_{out}$, b=$X_{out}$+L3, R3=$R_{in}$, X3=$X_{in}$−L1, X4=L2, and X2=VC1, VC1, it is possible to obtain VC1 by solving the above quadratic equation.

By obtaining the value of VC1 in this manner, it is also possible to calculate the value of another variable element VC2.

Third Embodiment

Figure 29:
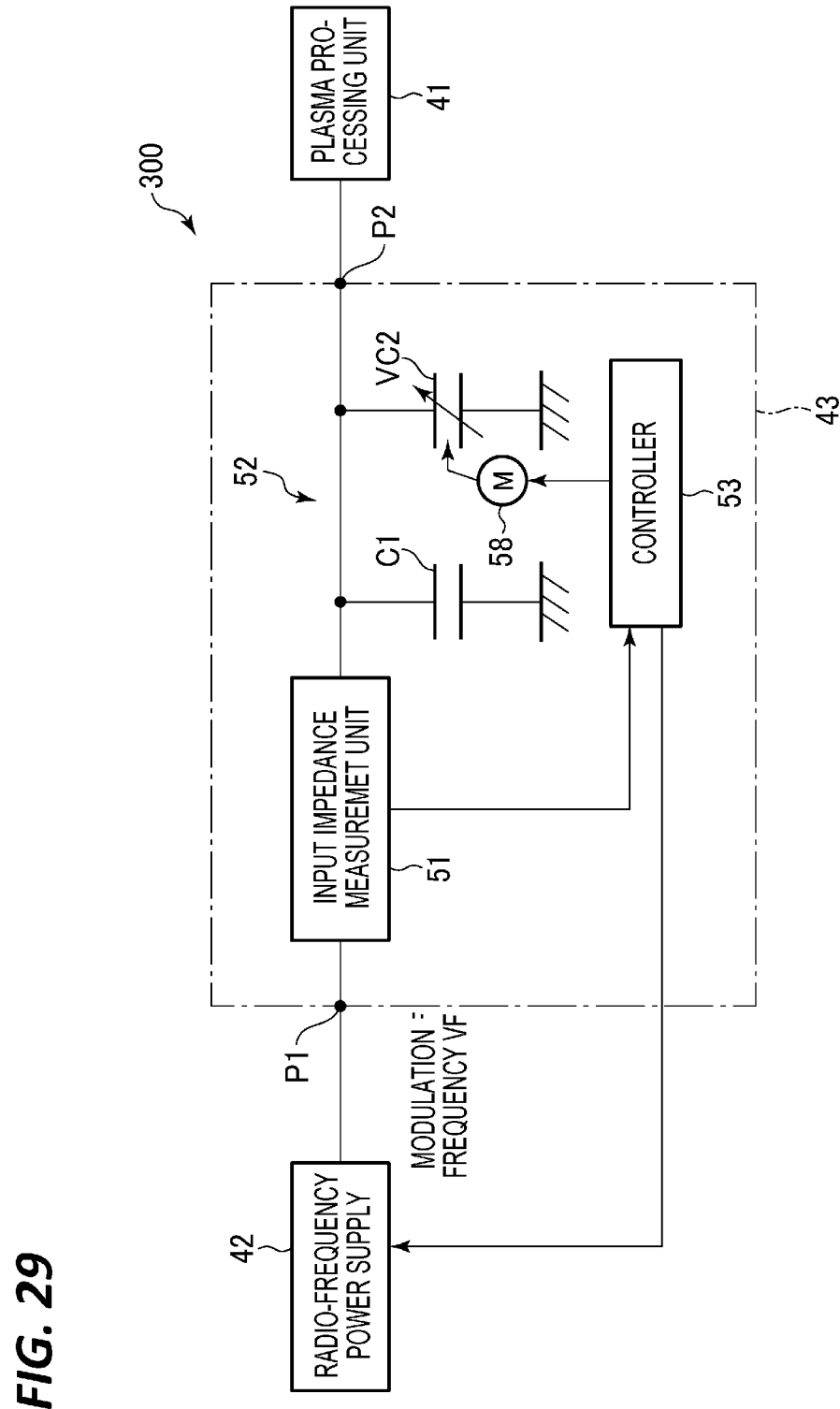
FIG. 29 is a block diagram illustrating a plasma processing apparatus including an impedance matching device according to a third embodiment.

FIG. 29 is a block diagram illustrating a plasma processing apparatus including an impedance matching device according to a second embodiment.

A plasma processing apparatus 300 of the present embodiment includes a plasma processing unit 41, a radio-frequency power supply 42 configured to supply radio-frequency power to the plasma processing unit 41, and an impedance matching device 43 provided between the radio-frequency power supply 42 and the plasma processing unit 41.

The plasma processing unit 41 has a chamber configured to accommodate a substrate to be processed and an electrode. By supplying radio-frequency power from the radio-frequency power supply 42 to the electrode, plasma is generated in the chamber.

The radio-frequency power supply 42 has a frequency modulation function, and the modulation frequency VF functions as a variable component of the impedance matching device 43 described later. That is, the frequency modulation unit of the radio-frequency power supply 42 constitutes a portion of the impedance matching device 43.

The impedance matching device 43 is for automatically matching the radio-frequency power supply side impedance with the load (e.g., an electrode, plasma, or chamber) side impedance, and includes an input impedance measurement unit 51, a matching circuit unit 52, and a controller 53.

In the present embodiment, the impedance matching device 43 is configured in a π/T type+VF type. That is, as the variable components used for impedance matching, for the radio-frequency power supply 42 of the matching circuit unit 52, the variable capacitor VC2 connected in series with the load on the plasma processing unit 41 side and the modulation frequency VF of the radio-frequency power supply 42 are used. In addition, for the radio-frequency power supply 42, the matching circuit unit 52 has a fixed capacitor C1 connected in parallel to the load on the plasma processing unit 41 side. Positions defining the capacitances of the variable capacitor is adjusted by step motor 58.

Since the radio-frequency power supply 42 and the transmission cable are usually designed to have a pure resistance output of 50Ω, the controller 53 controls the frequencies of the step motor 58 and the radio-frequency power supply 42 such that the impedance on the load side in which the impedance matching device 3 is also included is 50Ω. That is, the step motor 58 and the radio-frequency power supply 42 function as variable units. The other circuit components of the matching circuit unit 52 are omitted here.

The input impedance measurement unit 51 is provided at the input portion of the impedance matching device 43, that is, at the front stage of the matching circuit unit 52, and measures the input impedance viewed from the input portion of the impedance matching device 43. The input impedance measurement unit 51 is configured to be the same as the input impedance measurement unit 11 of the first embodiment.

The controller 53 stores a theoretical circuit model that simulates a network on the load side in which the matching circuit unit 52 in an actual machine is included.

In the present embodiment, like the controller 13 of the first embodiment, the controller 53 substitutes the circuit on the load side in the actual machine with the stored theoretical circuit model, and performs an arithmetic operation based on matching conditions on the theoretical circuit model based on the measurement results of the actual machine. Then, based on the result of the arithmetic operation, the position of the variable capacitor VC2 and the modulation frequency VF of the radio frequency power supply 42 are simultaneously changed to converge on the matching point.

Figure 30:
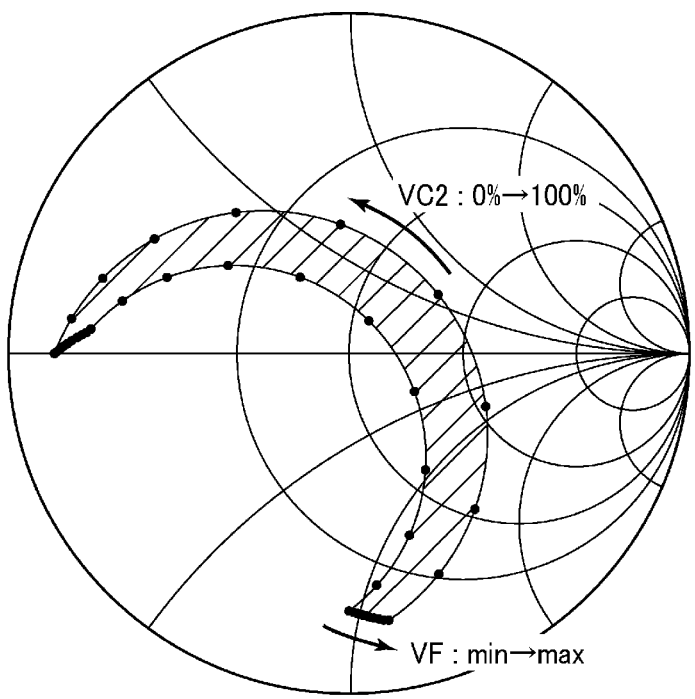
FIG. 30 is a diagram illustrating a load impedance matching range on a Smith chart in the impedance matching device of FIG. 29.

In this embodiment, by matching the impedance by the modulation frequency VF and the position of the variable capacitor VC2 as variable components, the matching range of the load impedance (output impedance) is as illustrated in FIG. 30. That is, by changing VC2 from 0% to 100% and the modulation frequency VF from min to max, it is possible to achieve complete matching within the matching range on the Smith chart illustrated in FIG. 30.

Figure 31:
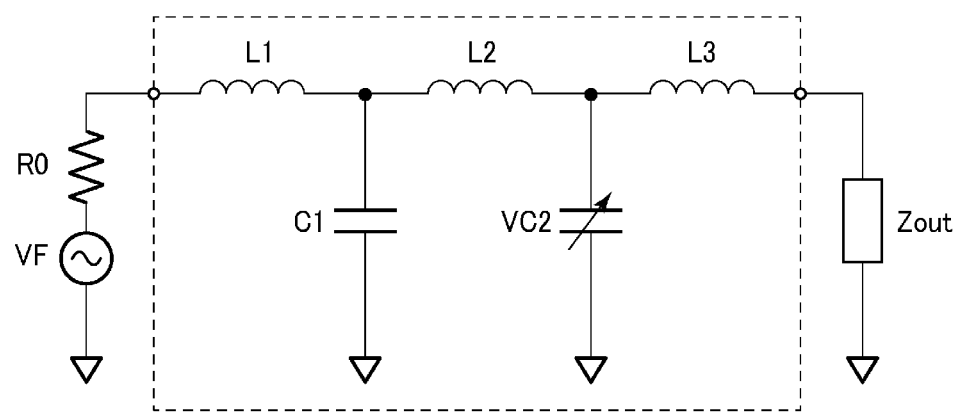
FIG. 31 is a circuit diagram illustrating an example of a theoretical circuit model of the impedance matching device according to the third embodiment.

Also in the present embodiment, since the circuit configuration on the load side in which the matching circuit unit 52 of the impedance matching device 43 in the actual machine is included is complicated, a simplified theoretical circuit model simulating the circuit configuration of the actual device is stored in the controller 53 in consideration of facilitation of calculation. As the theoretical circuit model, for example, a standard circuit model illustrated in FIG. 31 is used. In FIG. 31, $Z_{in}$ is an input impedance, and $Z_{out}$ is an output impedance.

Figure 32:
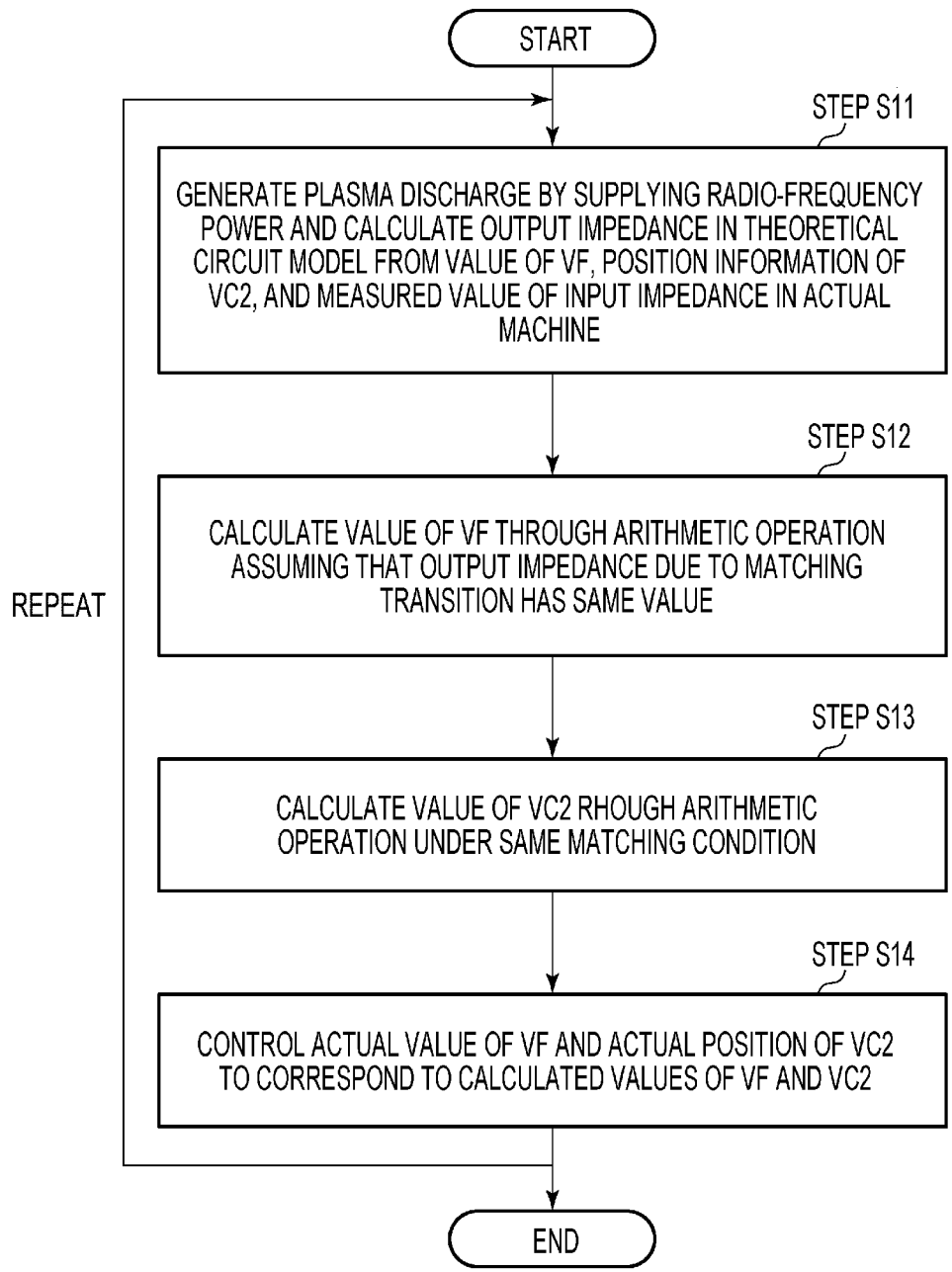
FIG. 32 is a flowchart illustrating an automatic matching algorithm in the third embodiment.

Next, an automatic matching algorithm executed based on the controller 53 will be described. FIG. 32 is a flowchart illustrating an automatic matching algorithm at that time. The algorithm of this embodiment is basically the same as that of the first embodiment.

First, when the frequency of the radio-frequency power supply is an arbitrary frequency, and the variable capacitor VC2 of the impedance matching device 43 exists at an arbitrary position (capacitance), radio-frequency power is supplied from the radio-frequency power supply 42 so as to generate plasma discharge. In this state, the controller 53 calculates the output impedance $Z_{out}$ in the theoretical circuit model from the actual modulation frequency VF of the radio-frequency power supply 42, the actual position information (capacitance) of the variable capacitor VC2, and the measured value of the input impedance in the actual machine (step 11).

Next, the controller 53 assumes that the output impedance due to the matching transition has the same value, and, based on the calculated value of the output impedance $Z_{out}$, the controller 53 calculates the value of the modulation frequency VF of the radio-frequency power supply 42 at the time of impedance matching through an arithmetic operation at a matching condition (input impedance=50Ω±0jΩ) in the theoretical circuit model (step S12).

Next, the controller 53 calculates the value of the variable capacitor VC2 at the time of impedance matching through an arithmetic operation under the same matching condition based on the calculated value of the modulation frequency VF described above (step S13). Step S12 and step S13 may be reversed.

Then, the controller 53 controls the modulation frequency VF of the actual radio-frequency power supply 42 and the position of variable capacitor VC2 to correspond to the value of the modulation frequency VF and the value of variable capacitor VC2 calculated in steps S12 and S13 (step S14).

Then, the above steps 11 to 14 are repeated.

By this, |Γ| converges to the matching point, and finally reaches complete matching. As the differences between the theoretical circuit model and the actual machine circuit (a difference in circuit component and a difference in circuit constant (especially a difference in variable element value)) become larger, the number of repetitions increases, but it is possible to make the theoretical circuit model and the actual machine circuit eventually reach the complete matching.

In the present embodiment as well, as in the first embodiment, the circuit on the load side in the actual machine is substituted with the theoretical circuit model, and an arithmetic operation based on matching conditions on the theoretical circuit model is performed based on the measurement results of the actual machine. Then, based on the arithmetic operation result, the modulation frequency VF and the position of the variable capacitor VC2 as variable components are simultaneously changed to converge on the matching point. Therefore, an unnecessary operation such as, for example, hunting, occurs, and it is possible to perform impedance matching in a short time.

In addition, even if the theoretical circuit model used for the arithmetic operation is different from the actual machine circuit, it is possible to make the theoretical circuit model reach the matching point by adjusting the number of repetitions of the steps S11 to S14. In contrast, by making the theoretical circuit model used for the arithmetic operation closer to the actual machine circuit within the range where the above arithmetic operation can be performed without difficulty, it is possible to reduce the number of repetitions of steps S11 to S14 so as to perform the matching operation in a shorter time.

[Arithmetic Operation Procedure]

Next, an example of a specific arithmetic operation procedure of steps S11 to S13 in the third embodiment will be described. As the theoretical circuit, the one illustrated in FIG. 31 is illustrated.

In the present embodiment, the arithmetic operation of the output impedance may be performed in the same manner as in the second embodiment.

Next, the calculation procedure of VF and VC2 based on the matching condition will be described.

Here, the procedure is performed in the same manner as in the case of using simultaneous equations based on two parallel connection points in the second embodiment.

Figure 33:
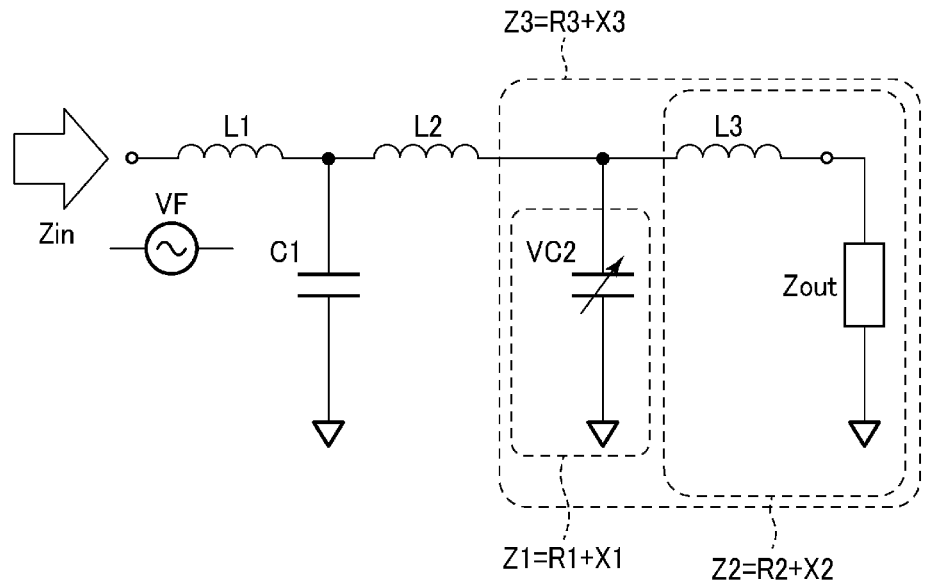
FIG. 33 is Analysis Diagram 1 when calculating VF and VC2 under a matching condition of the third embodiment.
Figure 34:
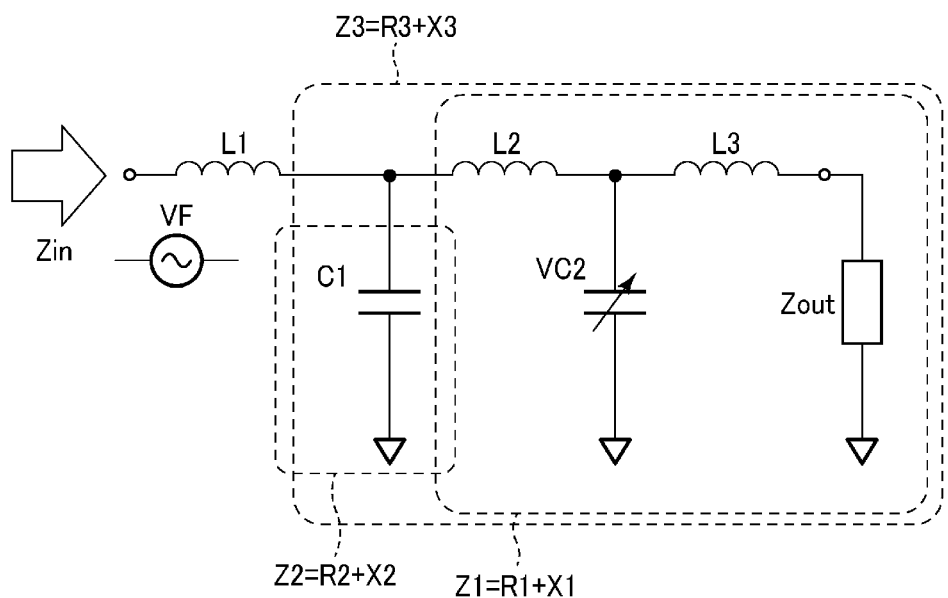
FIG. 34 is Analysis Diagram 2 when calculating VF and VC2 under a matching condition of the third embodiment.

FIG. 33 and FIG. 34 are diagrams for explaining the calculation procedure in this embodiment, in which FIG. 33 is Analysis Diagram 1 and FIG. 34 is Analysis Diagram 2.

In FIG. 33, Z1 is the impedance of VC2, Z2 is the combined impedance after the VC2 output, and Z3 is the combined impedance up to the VC2 input.

In FIG. 33, the following is established.

$$Z3=Z1//Z2$$

$$Z1=R1+X1, R1=0, X1=VC2$$

$$Z2=R2+X2, R2=R_{out}, X2=X_{out}+L3$$

From the parallel decomposition arithmetic operation, as represented in Equation (1) described above, the following is established.

$$R1=\{(R2*R3-X2*X3)*(R2-R3)+(R3*X2+R2*X3)*(X2-X3)\}/\{(R2-R3)^2+(X2-X3)^2\}$$

Since R1=0, as the numerator-only condition, the following Equation (3) is established as in the case of using simultaneous equations based on two parallel connection points in the second embodiment.

$$(R2*R3-X2*X3)*(R2-R3)+(R3*X2+R2*X3)*(X2-X3)=0 \quad (3)$$

In FIG. 34, Z1 is the combined impedance after the C1 output, Z2 is the impedance of C1, and Z3 is the combined impedance up to the C1 input.

In FIG. 34, the following is established.

$$Z3=Z1//Z2$$

$$Z3=R3+X3, R3=R_{in}, X3=X_{in}-L1$$

$$Z2=R2+X2, R2=0, X2=VC1$$

$$Z1=R1+X1, R1=R3', X1=X3'+L2$$

(here, R3' and X3' are the same as R3 and X3 in Analysis Diagram 1)

From the parallel decomposition arithmetic operation, as represented in Equations (1) and (2) described above, the following is established.

$$R1=\{(R2*R3-X2*X3)*(R2-R3)+(R3*X2+R2*X3)*(X2-X3)\}/\{(R2-R3)^2+(X2-X3)^2\}$$

$$X1=\{(R2*X3+R3*X2)*(R2-R3)-(R2*R3-X2*X3)*(X2-X3)\}/\{(R2-R3)^2+(X2-X3)^2\}$$

Upon substituting R2=0, the following Equations (4) and (5) are derived as in the case of using simultaneous equations based on two parallel connection points in the second embodiment.

$$R1=R3*X2^2/\{(X2-X3)^2+R3^2\} \quad (4)$$

$$X1=(-R3^2*X2+X2^2*X3-X2*X3^2)/\{(X2-X3)^2+R3^2\} \quad (5)$$

In order to set Equations (3) to (5) described above as simultaneous equations, respective parameters are changed and matched.

In Equation (3), it is assumed that R2=a, X2=b, R3=R, and X3=X. Then, Equation (3) described above becomes Equation (3)' as follows.

$$(a*R-b*X)*(a-R)+(a*X+b*R)*(b-X)=0 \quad (3)'$$

In Equations (4) and (5), it is assumed that R1=R and X=X1-X4(X4=L2). Then, Equations (4) and (5) described above become Equations (4)' and (5)' as follows.

$$R=R3*X2^2/\{(X2-X3)^2+R3^2\} \quad (4)'$$

$$X=[-R3^2*X2+X2^2*X3-X2*X3^2-X4*\{(X2-X3)^2+R3^2\}]/\{(X2-X3)^2+R3^2\} \quad (5)'$$

Upon substituting Equations (4)' and (5)' into Equation (3)' and expanding Equations (4)' and (5)' with respect to each frequency: ω, Equation (7) is obtained as follows.

$$+\{(-1*R0*L1^4*L2^2*C1^4)\}*\omega^{10}+ \quad (7)$$
$$\{(-2*R0*R1^2*L1^2*L2^2*C1^4)+$$
$$(4*R0*L1^3*L2^2*C1^3)+(2*R0*L1^4*L^2*C1^3)\}*\omega^8+$$
$$\{(-1*R0*R1^4*L2^2*C1^4)+(4*R0*R1^2*L1*L2^2*C1^3)+$$
$$(4*R0*R1^2*L1^2*L2*C1^3)+$$
$$(-1*R0*L1^4*C1^2)+(-6*R0*L1^2*L2^2*C1^2)+$$
$$(-6*R0*L1^3*L2*C1^2)+(R1*L1^2*L3^2*C1^2)\}*\omega^6+$$
$$\{(2*R^1*X0*L1^2*L3*C1^2)\}*\omega^5+$$

-continued
$$\{(2*R0*R1^4*L2*C1^3)+(-2*R0*R1^2*L2^2*C1^2)+$$
$$(-2*R0*R1^2*L1^2*C1^2)+$$
$$(-6*R0*R1^2*L1*L2*C1^2)+(2*R0*L1^3*C1)+$$
$$(6*R0*L1^2*L2*C1)+(4*R0*L1*L2^2*C1)+$$
$$(-2*R1*L1*L3^2*C1)+(R1*X0^2*L1^2*C1^2)+$$
$$(R1^3*L3^2*C1^2)+(R0^2*R1*L1^2*C1^2)\}*\omega^4+$$
$$\{(-4*R1*X0*L1*L3*C1)+(2*R13*X0*L3*C1^2)\}*\omega^3+$$
$$\{(-R0*R14*C1^2)+(2*R0*R1^2*L1*C1)+$$
$$(2*R0*R1^2*L2*C1)+(-R0*L1^2)+(-2*R0*L1*L2)+$$
$$(-R0*L2^2)+(-2*R1*X02*L1*C1)+$$
$$(R1*L3^2)+(R1^3*X02*C1^2)+(R02*R1^3*C1^2)+$$
$$(-2*R0^2*R1*L1*C1)\}*\omega^2+\{(2*R1*X0*L3)\}*\omega+$$
$$\{(-1*R0*R1^2)+(R1*X0^2)+(R0^2*R1)\}=0$$

This equation becomes the following 10-order equation, where ω is x.

$$a0x^{10}+a2x^8+a4x^6+a5x^5+a6x^4+a7x^3+a8x^2+a9x+a^{10}=0$$

Since the solution of a multidimensional equation may be obtained by an algebra method such as, for example, the DKA method, it is possible to obtain the value of to. The modulation frequency VF may be obtained from ω=2πf, and the value of the variable element VC2 may be obtained from the value of the modulation frequency VF.

<Other Application>

For example, in the above embodiments, the impedance matching at the time of supplying radio-frequency power to the plasma load has been described, but the present disclosure is not limited thereto. In addition, the configurations of the impedance matching devices are not limited to those of the first to third embodiments, as long as impedance matching can be performed by two variable components. In addition, the theoretical circuit models are not limited to those illustrated in each embodiment, and may be set as appropriate.

According to the present disclosure, there are provided an impedance matching method and an impedance matching device that are capable of performing matching in a short time without causing an unnecessary operation such as, for example, hunting.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An impedance matching method using an impedance matching device provided between a radio-frequency power supply and a load, the impedance matching method comprising:
calculating an output impedance in a theoretical circuit model set in advance and simulating a circuit configuration of a load side in which a matching circuit of the impedance matching device is included from actual values of two variable components used for impedance matching of the impedance matching device and a measured value of an input impedance viewed from an input portion of the impedance matching device;
calculating values of the two variable components at a time of impedance matching through an arithmetic operation under a matching condition in the theoretical circuit model based on a calculated value of the output impedance, assuming that the output impedance due to matching transition has the same value; and
controlling the actual values of the variable components of the impedance matching device to correspond to the calculated values of the two variable components.

2. The impedance matching method according to claim 1, wherein the calculating the output impedance, the calculating the values of the two variable components, and the controlling the values of the actual variable components are repeated until the impedance matches.

3. The impedance matching method according to claim 2, wherein the two variable components are variable elements.

4. The impedance matching method according to claim 3, wherein a first variable capacitor and a second variable capacitor are provided as the two variable elements.

5. The impedance matching method according to claim 4, wherein the impedance matching device is of an inverted L type in which the first variable capacitor and the second variable capacitor are respectively connected in parallel and in series to the load with respect to the radio-frequency power supply.

6. The impedance matching method according to claim 4, wherein the impedance matching device is of a π type in which the first variable capacitor and the second variable capacitor are both connected in parallel to the load with respect to the radio-frequency power supply.

7. The impedance matching method according to claim 2, wherein the radio-frequency power supply has a frequency modulation function, one of the variable components is a modulation frequency of the radio-frequency power supply, and a remaining one of the variable components is a variable element.

8. The impedance matching method according to claim 7, wherein the impedance matching device is of a π/T type+VF type in which the variable element is a variable capacitor, the variable capacitor is connected in series to the load with respect to the radio-frequency power supply, and a fixed capacitor connected in parallel to the load with respect to the radio-frequency power supply is further provided.

9. The impedance matching method according to claim 8, wherein the load includes a plasma load of a plasma processing unit, and
the calculating the output impedance is performed in a state where radio-frequency power is supplied from the radio-frequency power supply to the plasma processing unit and plasma discharge is generated.

10. An impedance matching device provided between a radio-frequency power supply and a load, the impedance matching device comprising:
two variable components used for impedance matching;
a modulator configured to make the two variable components variable; and
a controller configured to control the modulator so as to control an impedance between the radio-frequency power and the load,
wherein the controller stores a theoretical circuit model that simulates a circuit configuration on a load side in which a matching circuit of the impedance matching device is included, and the controller is configured to:
calculate an output impedance in the theoretical circuit model from actual values of two variable components used for the impedance matching of the impedance matching device and a measured value of an input impedance viewed from an input portion of the impedance matching device;
calculate values of the two variable components at a time of the impedance matching through an arithmetic operation under a matching condition in the theoretical circuit model based on a calculated value of the output impedance, assuming that the output impedance due to a matching transition has the same value; and
control the actual values of the variable components of the impedance matching device to correspond to the calculated values of the two variable components.

11. The impedance matching device according to claim 10, wherein the calculating the output impedance, the calculating the values of the two variable components, and the controlling the values of the actual variable components are repeated until the impedance matches.

12. The impedance matching device according to claim 11, wherein the two variable components are variable elements.

13. The impedance matching device according to claim 12, wherein a first variable capacitor and a second capacitor are provided as the two variable elements.

14. The impedance matching device according to claim 13, wherein the impedance matching device is of an inverted L type in which the first variable capacitor and the second variable capacitor are respectively connected in parallel and in series to the load with respect to the radio-frequency power supply.

15. The impedance matching device according to claim 13, wherein the impedance matching device is of a π type in which the first variable capacitor and the second variable capacitor are both connected in parallel to the load with respect to the radio-frequency power supply.

16. The impedance matching device according to claim 11, wherein the radio-frequency power supply has a frequency modulation function, one of the variable components is a modulation frequency of the radio-frequency power supply, and a remaining one of the variable components is a variable element.

17. The impedance matching device according to claim 16, wherein the impedance matching device is of a π/T type+VF type in which the variable element is a variable capacitor, the variable capacitor is connected in series to the load with respect to the radio-frequency power supply, and a fixed capacitor connected in parallel to the load with respect to the radio-frequency power supply is further provided.

18. The impedance matching device according to claim 17, wherein the load includes a plasma load of a plasma processing unit, and
the controller is configured to execute the step of calculating the output impedance is performed in a state where radio-frequency power is supplied from the radio-frequency power supply to the plasma processing unit and plasma discharge is generated.

\* \* \* \* \*